(12) United States Patent
Asao

(10) Patent No.: US 9,263,501 B1
(45) Date of Patent: Feb. 16, 2016

(54) MEMORY DEVICE AND METHOD OF MANUFACTURING THE SAME

(71) Applicant: Kabushiki Kaisha Toshiba, Minato-ku (JP)

(72) Inventor: Yoshiaki Asao, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/636,538

(22) Filed: Mar. 3, 2015

(30) Foreign Application Priority Data

Sep. 30, 2014 (JP) .................. 2014-202639

(51) Int. Cl.
*H01L 27/24* (2006.01)
*H01L 45/00* (2006.01)

(52) U.S. Cl.
CPC ........ *H01L 27/2463* (2013.01); *H01L 27/2436* (2013.01); *H01L 45/06* (2013.01); *H01L 45/08* (2013.01); *H01L 45/12* (2013.01); *H01L 45/1233* (2013.01); *H01L 45/144* (2013.01); *H01L 45/148* (2013.01)

(58) Field of Classification Search
CPC . H01L 27/2436; H01L 27/2463; H01L 45/06; H01L 45/08; H01L 45/12; H01L 45/1233; H01L 45/144; H01L 45/148
See application file for complete search history.

(56) References Cited

U.S. PATENT DOCUMENTS

| 8,129,709 | B2* | 3/2012 | Seko | H01L 27/2436 257/2 |
|---|---|---|---|---|
| 8,513,751 | B2 | 8/2013 | Asao | |
| 8,559,210 | B2 | 10/2013 | Miyata et al. | |
| 2005/0263823 | A1* | 12/2005 | Hwang | H01L 29/7843 257/368 |
| 2007/0153616 | A1* | 7/2007 | Kim | G11C 8/12 365/230.03 |
| 2008/0247225 | A1* | 10/2008 | Liu | G11C 13/0004 365/163 |
| 2009/0108247 | A1* | 4/2009 | Takaura | G11C 13/0004 257/2 |
| 2011/0211390 | A1* | 9/2011 | Hanzawa | G11C 13/0004 365/163 |
| 2012/0127778 | A1 | 5/2012 | Miyata et al. | |
| 2012/0243296 | A1 | 9/2012 | Watanabe et al. | |
| 2012/0286339 | A1 | 11/2012 | Asao | |
| 2013/0021834 | A1 | 1/2013 | Koyama | |
| 2015/0249111 | A1* | 9/2015 | Kang | G06F 13/28 710/308 |

FOREIGN PATENT DOCUMENTS

JP 2011-49581 A 3/2011
JP 5348108 B2 11/2013

OTHER PUBLICATIONS

G.Servalli, "A 45nm Generation Phase Change Memory Technology", IEDM09, IEEE, 2009, pp. 5.7.1-5.7.4.

* cited by examiner

*Primary Examiner* — Allan R Wilson
(74) *Attorney, Agent, or Firm* — Oblon, McClelland, Maier & Neustadt, L.L.P.

(57) ABSTRACT

According to one embodiment, a memory device includes a first diffusion layer region on, a second diffusion layer region, a third diffusion layer region, a first gate electrode and a second gate electrode. The memory device also includes a first via contact group, a second via contact group and a variable resistance element. At least one of the plurality of first via contacts is electrically connected to the first diffusion layer region with one end and at least one of the plurality of second via contacts is electrically connected to the third diffusion layer region with one end. The variable resistance element being electrically a first interconnect layer.

20 Claims, 26 Drawing Sheets

MEMORY DEVICE AND METHOD OF MANUFACTURING THE SAME

CROSS-REFERENCE TO RELATED APPLICATIONS

This application is based upon and claims the benefit of priority from Japanese Patent Application No. 2014-202639, filed on Sep. 30, 2014; the entire contents of which are incorporated herein by reference.

FIELD

Embodiments described herein relate to a memory device and a method for manufacturing the same.

BACKGROUND

As a variable resistance memory, various memories such as a super-lattice phase change memory, a phase change memory, and an ion memory have been proposed and developed. The memories respectively adopt different operational principles such as a phase change of a super-lattice, a change of a crystalline state, and filament forming performed through ionic conduction. However, all the memories are in common with one another in that resistance of a memory element thereof is transitional between a high-resistance state and a low-resistance state by being applied with a voltage or a current. In such memory devices, reduction of manufacturing cost is also required.

DETAILED DESCRIPTION

According to one embodiment, a memory device includes a first diffusion layer region on, a second diffusion layer region, a third diffusion layer region, a first gate electrode and a second gate electrode on a substrate. The second diffusion layer region is provided between the first diffusion layer region and the third diffusion layer region. The first gate electrode is provided between the first diffusion layer region and the second diffusion layer region. The second gate electrode is provided between the second diffusion region and the third diffusion region. The memory device also includes a first via contact group, a second via contact group and a variable resistance element. The second via contact group is apart from the first via contact group in the second direction. At least one of the plurality of first via contacts is electrically connected to the first diffusion layer region with one end and at least one of the plurality of second via contacts is electrically connected to the third diffusion layer region with one end. The variable resistance element is electrically a first interconnect layer.

Hereinafter, embodiments of the invention will be described with reference to the drawings.

In the following description, a semiconductor substrate side will be mentioned while being referred to as a lower side, for convenience. Moreover, in the specification, the term "intersect" denotes that two lines cross each other.

First Embodiment

Figure 1:
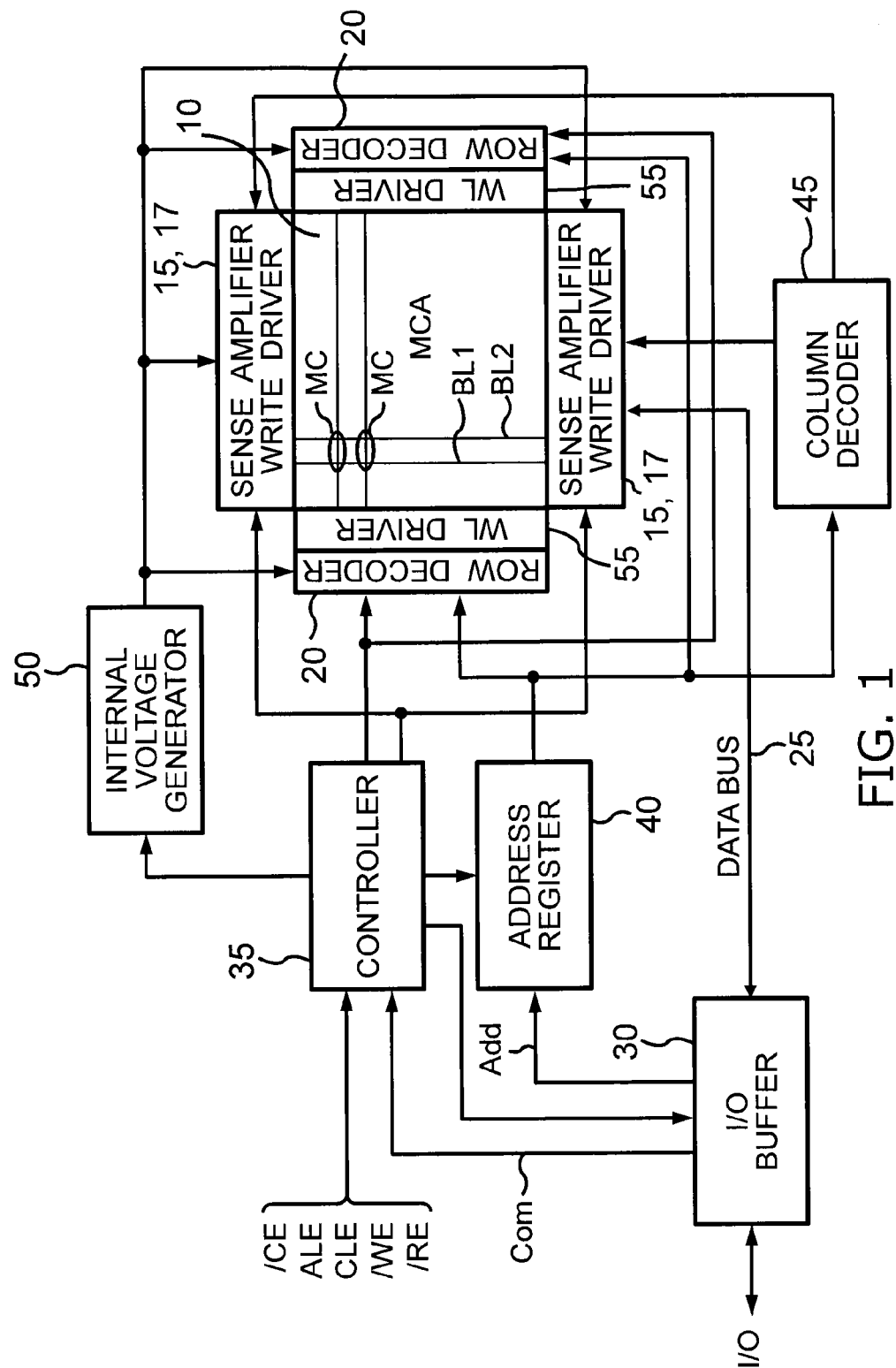
FIG. 1 is a block diagram showing a configuration of a variable resistance memory of a first embodiment.
Figure 2:
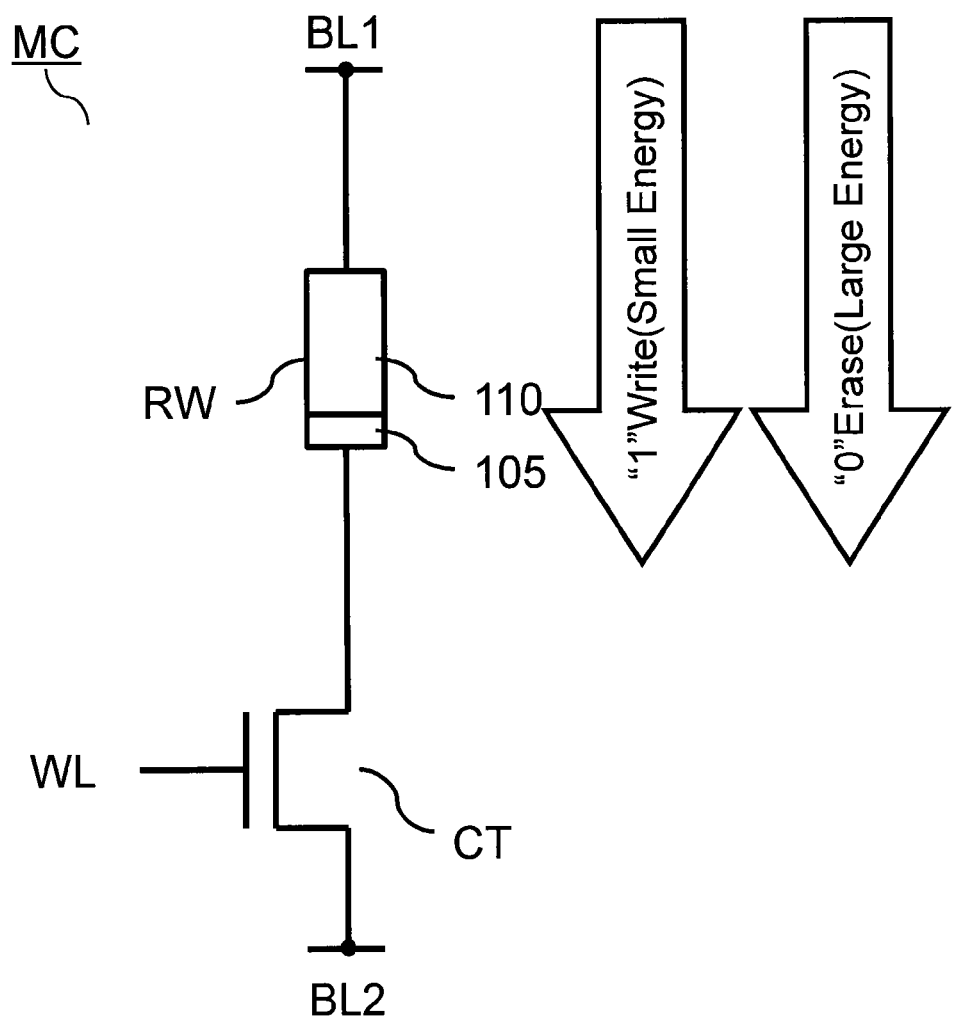
FIG. 2 is a diagram for describing a configuration and an operation of the memory cell MC of the first embodiment.

FIG. 1 is a block diagram showing a configuration of a variable resistance memory of a first embodiment. In a memory cell array 10, a plurality of memory cells MC are arranged in a matrix. As shown in FIG. 2, each memory cell MC includes a variable resistance element RW and a cell transistor CT. The variable resistance element RW is an element which stores data in response to a change of a resistance state and in which data is rewritable by using a current. The cell transistor CT is provided to correspond to the variable resistance element RW. When the cell transistor CT is in a conduction state, a current flows in the corresponding variable resistance element RW.

In the memory cell array 10, a plurality of word lines WL are extending in a row direction (a second direction) and a plurality of bit lines BL are extending in a column direction (a first direction) so as to intersect with each other. Two bit lines BL form a pair. The memory cell MC is provided to correspond to an intersection point of the word line WL and the pair of the bit lines (the pair of a first bit line BL1 and a second bit line BL2). The variable resistance element RW and the cell transistor CT in each memory cell MC are connected to each other in series. The variable resistance element RW is connected to one bit line of the pair of the bit lines (for example, BL1 and BL2), and the cell transistor CT is connected to the other bit line of the pair of the bit lines. A gate electrode of the cell transistor CT is connected to the word line WL.

A sense amplifier 15 and a write-driver 17 are provided on both sides of the memory cell array 10 in a bit line direction. The sense amplifier 15 is connected to a bit line BL and reads out data stored in the memory cell MC by detecting a current flowing in the memory cell MC which is connected to a selection word line WL. The write-driver 17 is connected to the bit line BL and writes data by causing a current to flow in the memory cell MC which is connected to the selection word line WL.

A row decoder 20 and a word line driver 55 are respectively provided on both sides of the memory cell array 10 in a word line direction. The word line driver 55 connects to the word line WL and applies a voltage to the selection word line WL at the time of data reading or data writing.

A data transfer between the sense amplifier 15 or the write-driver 17 and an external input/output terminal I/O is performed via a data bus 25 and an I/O buffer 30.

Various external control signals such as a chip enable signal/CE, an address latch enable signal ALE, a command latch enable signal CLE, a write enable signal/WE, and a read-out enable signal/RE are input in a controller 35. The controller 35 distinguishes an address signal Add and the command signal Com which are supplied from the external input/output terminal I/O, based on the control signals thereof. Then, the controller 35 transmits the address signal Add to the row decoder 20 and a column decoder 45 via an address resistor 40. The controller 35 decodes the command signal Com. The sense amplifier 15 applies a voltage to the bit line BL in accordance with a column address decoded by the column decoder 45. The word line driver 55 applies a voltage to the word line WL in accordance with a row address decoded by the row decoder 20.

The controller 35 performs each of sequential controls of data reading, data writing and erasing in accordance with the address signal Add and the command signal Com. An internal voltage generation circuit 50 generates an internal voltage (for example, a voltage obtained by boosting a power supply voltage supplied from outside the variable resistance memory) which are necessary for each operation. The internal voltage generation circuit 50 is also controlled by the controller 35, thereby generating a necessary voltage.

FIG. 2 is a diagram for describing a configuration and an operation of the memory cell MC of the embodiment. In the embodiment, the variable resistance element RW of the memory cell MC is connected to the first bit line BL1 and the cell transistor CT. The cell transistor CT is connected to the variable resistance element RW and the second bit line BL2.

As an example of the variable resistance element RW, FIG. 2 shows a super-lattice phase change memory element.

In the super-lattice phase change memory element, a crystalline structure of a super-lattice varies by being applied with electric energy so as to be able to be in a low-resistance state and a high-resistance state. Here, data of 1-bit can be stored in the super-lattice phase change memory element by defining the low-resistance state as data "1" and defining the high-resistance state as data "0". The low-resistance state may be defined as "0" and the high-resistance state may be defined as "1".

For example, as shown in FIG. 2, the super-lattice phase change memory element includes a super-lattice layer 110 in which an orientation layer 105, a first crystal layer, and a second crystal layer are used, for example. As necessary, the super-lattice phase change memory element includes an electrode layer (not illustrated).

Characteristics of the orientation layer 105 are improving orientation of the super-lattice layer 110. For example, the orientation layer 105 includes a crystalline structure of hexagonal crystal. Specifically, the orientation layer 105 includes a chalcogen compound having antimony and tellurium as main components, or a chalcogen compound having bismuth and tellurium as main components is used.

In the super-lattice layer 110, the first crystal layer and the second crystal layer are alternately stacked.

In the first crystal layer, positions of constituent atoms are reversibly transitional by being applied with electric pulses, and a chalcogen compound having germanium and tellurium as main components is used, for example.

The second crystal layer is a layer which assists atomic transition of the first crystal layer. Although a crystalline structure of the second crystal layer is not necessarily transitional, the crystalline structure thereof may be transitional. For example, the second crystal layer includes a chalcogen compound including antimony, or a chalcogen compound including bismuth and tellurium.

The super-lattice phase change memory element performs a writing operation (transition from data "0" to "1") and an erasing operation (transition from data "1" to "0") by adding electric energy, for example. Here, the term "electric energy" denotes integral calculus regarding a period of electric power.

In the super-lattice phase change memory element, the erasing operation requires electric energy greater than that in the writing operation. Therefore, a way of increasing a voltage applied at the time of erasing than a voltage applied at the time of writing, or a method of lengthening a period applying a voltage at the time of erasing than a period applying a voltage at the time of writing can be exemplified.

Moreover, in the super-lattice phase change memory element, the above-described transition occurs in a local region in which a current flows. When transition occurs in the local region, the local region has low electric resistance. Therefore, a current flows in the local region. In other words, little voltage is applied to other region, and the transition is suppressed in other region.

Figure 3:
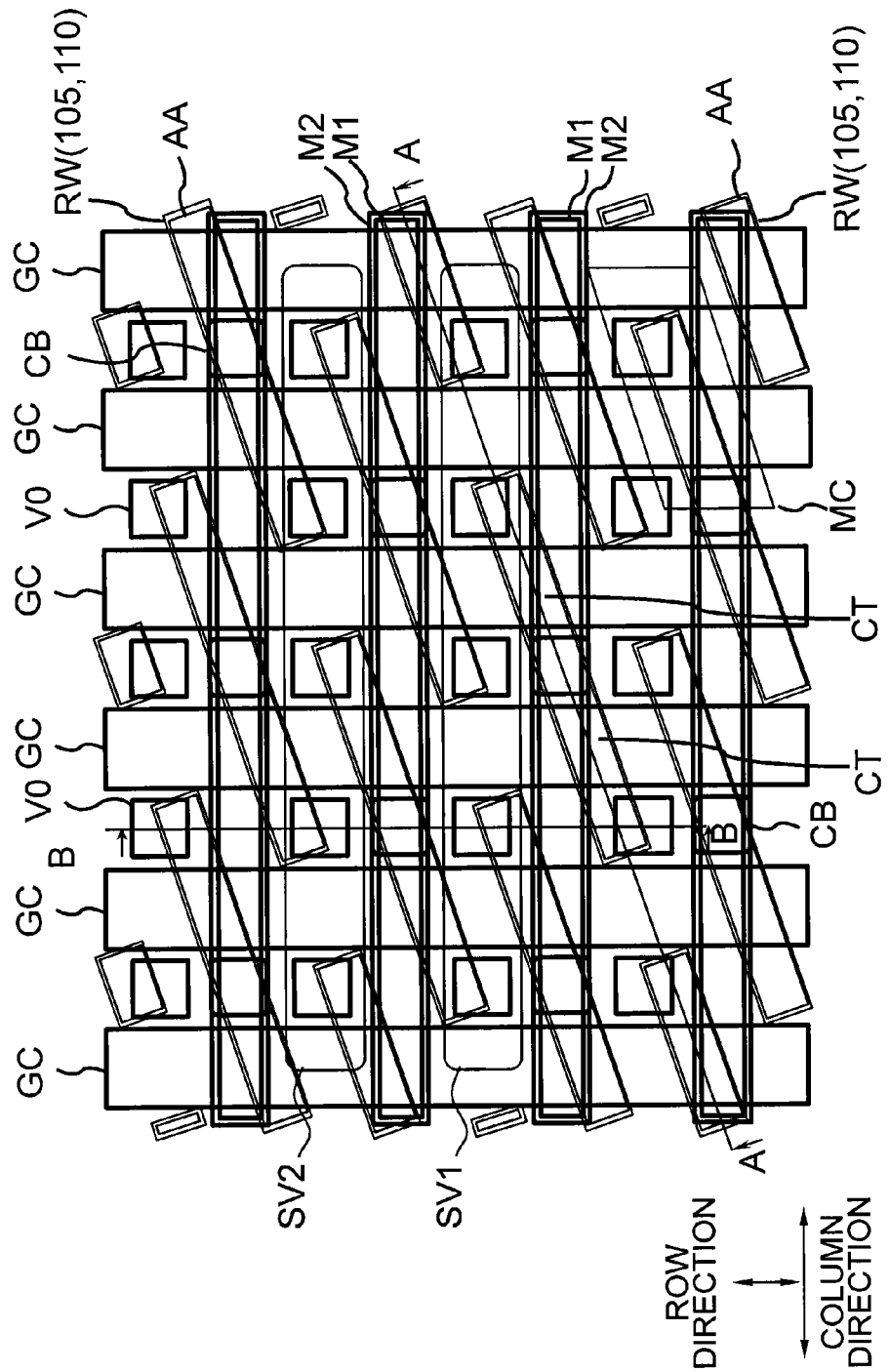
FIG. 3 is a layout of the variable resistance memory according to the first embodiment.
Figure 4A:
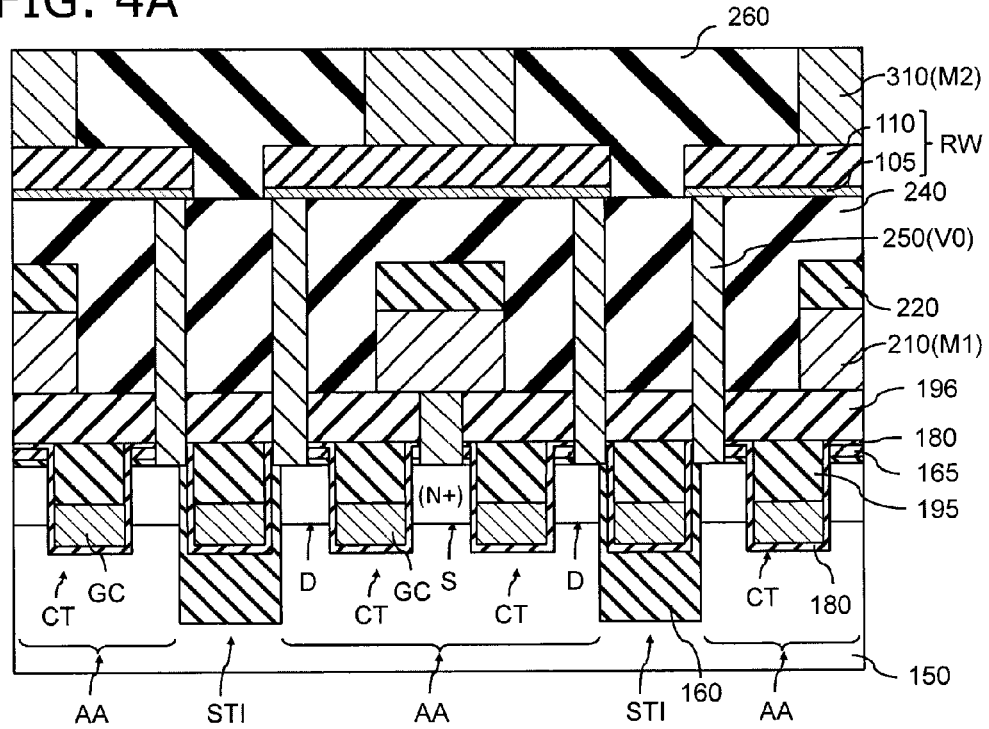
FIG. 4A is a cross-sectional view taken along line A-A in FIG. 3.
Figure 4B:
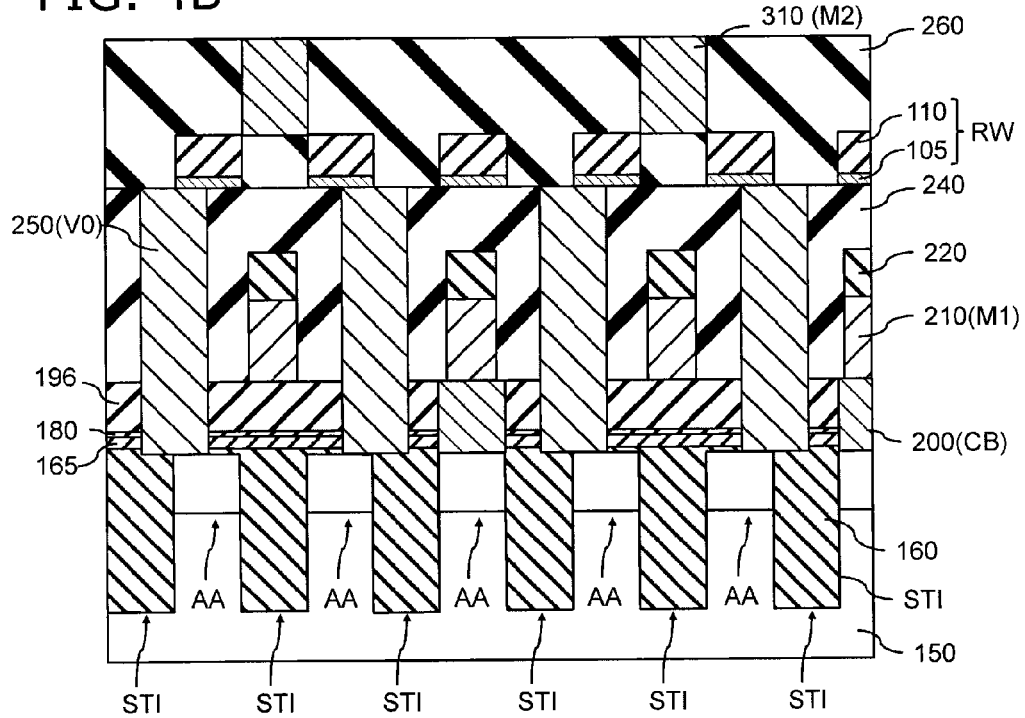
FIG. 4B is a cross-sectional view taken along line B-B in FIG. 3.

FIG. 3 is a planar layout of the variable resistance memory according to the first embodiment. FIG. 4A is a cross-sectional view taken along line A-A in FIG. 3. FIG. 4B is a cross-sectional view taken along line B-B in FIG. 3.

With reference to FIG. 4A, a cross-sectional view of the embodiment will be described. As shown in FIG. 4A, an active area AA and an element isolation region STI (shallow trench isolation) are formed on a semiconductor substrate 150. The cell transistor CT is formed in the active area AA. The cell transistor CT includes a gate electrode GC and a gate insulation film 180 which are embedded in the semiconductor substrate 150. n+-type source region S and drain region D are included on both sides of the gate electrode GC in the cell transistor CT. The source region S and the drain region D are referred to as a diffusion layer region when the source region S and the drain region D are not distinguished from each other. The gate electrode GC is also formed in the element isolation region STI. The gate electrode in the element isolation region STI does not function as a gate electrode of a transistor.

Two cell transistors CT are formed in the same active area AA, and the two cell transistors CT share the source region S. Sets of the two cell transistors CT sharing the source region S are arrayed as a repetitive pattern inside a chip throughout the row direction and the column direction.

The source region S of the cell transistor CT is electrically connected to a first interconnection layer M1 via a bit line contact CB. The first interconnection layer M1 forms the second bit line BL2.

The drain region D of the two cell transistor CT formed in the same active area AA is electrically connected to the orientation layer 105 which is a lower end of the same variable resistance element RW, through a via contact V0.

The super-lattice layer 110 on an upper end side of the variable resistance element RW is connected to a second interconnection layer M2. The second interconnection layer M2 forms the first bit line BL1.

In other words, in one variable resistance element RW, a lower side thereof is connected to two via contacts V0, and an upper side thereof is connected to one of the second interconnection layer M2.

The variable resistance element RW stores 1-bit data for one combination of the via contact V0 and the second interconnection layer M2. Therefore, since one variable resistance element RW is connected to two via contacts V0 and one second interconnection layer M2, 2-bit data is stored. As described above, the transition of the variable resistance element RW in the local area allows data to store. Therefore mutual interference between the 2-bit is suppressed.

A planar layout of the embodiment will be described with reference to FIG. 3. In the following description, a leading-out direction of the first interconnection layer M1 and the second interconnection layer M2 is referred to as the column direction (the first direction). In addition, a leading-out direction of the gate electrode GC substantially orthogonally crossing to the first direction is referred to as the row direction (the second direction).

Firstly, the active area AA is formed in the semiconductor substrate 150 having angles against both the column direction and the row direction. Two gate electrodes GC are formed in the active area AA. For example, the active area AA is formed at an angle of approximately (90−a tan(⅓)) against the row direction. That is, the active area AA is oblique to the row direction by an angle of approximately 71.565 degrees. Moreover, the active area AA is oblique to the column direction at an angle of approximately 18.453 degrees.

The active area AA and the gate electrode GC are formed so that a pitch of the active area AA and the gate electrode GC (the word line WL) in the row direction is 2:3. Here, the term "pitch" denotes the minimum repetitive length in the cyclically repetitive pattern.

The cell transistor CT is formed at an intersection point of the gate electrode GC and the active area AA. Two cell transistors CT are formed for one active area AA. The two cell transistors CT have one source region S and two drain regions D.

The active area AA electrically connects to the first interconnection layer M1 via the bit line contact CB. The first interconnection layer M1 extends in the substantially column direction.

Two via contacts V0 are connected to one active area AA. The two via contacts V0 electrically connects to the common variable resistance element RW.

The via contacts V0 are formed in a lattice shape. A plurality of the via contacts V0 which are formed in a substantially straight line in the column direction at predetermined intervals are referred to as a first via contact group SV1. Moreover, a plurality of the via contacts V0 which are adjacent to the first via contact group SV1 in the row direction and formed in a substantially straight line in the column direction at predetermined intervals are referred to as a second via contact group SV2.

When one via contact V0 connected to the active area AA belongs to the first via contact group SV1, the other via contact V0 connected to the active area AA belongs to the second via contact group SV2. This is because the active area AA is formed to have angles against both the column direction and the row direction, as described above.

Each variable resistance element RW is provided on the two via contacts V0. The variable resistance element RW is electrically connected to the second interconnection layer M2 thereon.

The second interconnection layer M2 is provided to intersect (cross) a substantially central portion of the variable resistance element RW thereon. The second interconnection layer M2 is formed to extend in the column direction.

As described above, data of 1-bit is stored for one combination of the via contact V0 and the second interconnection layer M2. Since one variable resistance element RW is connected to two via contacts V0 and one second interconnection layer M2, data of 2-bit is stored.

Here, the via contacts V0 are arranged at substantially equivalent intervals (equivalent pitches) in the column direction and the row direction. The reason is as follows.

As shown in FIG. 3, the pitch of the via contact V0 in the row direction is arranged to be $3/2$ times the pitch of the active area in the row direction. The pitch of the via contact V0 in the column direction is arranged by the pitch of the gate electrode GC (the word line WL).

As described above, the active area AA and the gate electrode GC are formed to have the pitch of the active area AA in the row direction to be $2/3$ times a ratio of the pitch of the gate electrode GC.

Therefore, the pitch of the via contact V0 in the row direction is equal to the pitch of the gate electrode GC. In other words, the pitch of the via contact V0 in the row direction is equal to the pitch of the via contact in the column direction.

Next, The first bit lines BL1 and the gate electrodes GC are arranged with the ratio which the pitch of the first bit lines BL1 is approximately equal to the pitch of the gate electrodes. The second bit lines BL2 and the gate electrodes GC are arranged in the ratio which the pitch of the second bit lines BL2 is approximately equal to the pitch of the gate electrodes GC. The reason is as follows.

As shown in FIG. 3, an arrangement is carried out to cause the pitch of the first bit line BL1 or the second bit line BL2 to be approximately $3/2$ times the pitch of the active area AA in the row direction.

As described above, the active area AA and the gate electrode GC are formed so that the pitch of the active area AA in the row direction is $2/3$ times a ratio of the pitch of the gate electrode GC.

Therefore, the ratio of the pitch of the first bit line BL1 and the second bit line BL2 is approximately equal to the ratio of the pitch of the gate electrodes GC with each other.

In this case, the second bit line BL2 needs to be arranged without being interfered by the via contact V0. This is realized by forming the active area AA to extend in a direction intersecting the gate electrode GC by an angle of (approximately 90−a tan($1/3$)). The reason is as follows.

According to the above description, both the via contact V0 and the second bit line BL2 are arranged at the pitch of the gate electrode GC in the row direction. In order to decrease interference between both thereof, it is desired to alternately arrange the via contact V0 and the second bit line BL2 to have half of the pitch of the gate electrodes GC in the row direction.

Then, in order to perform an alternate arrangement as described above and to prevent an erroneous operation of an adjacent memory cell MC, as shown in FIG. 3, substantially both ends of one active area AA is connected to the via contact V0 and a substantially central portion thereof is connected to the second bit line BL2 via the bit line contact CB.

Then, in order to form widths between the active areas AA to be approximately equivalent to one another, as shown in FIG. 3, the active area AA needs to be obliquely formed. In other words, the active area AA needs to be shifted by the pitch of the active areas AA in the row direction, that is, the pitch of $2/3$ times the gate electrode while being shifted by twice of the pitch of the gate electrodes in the column direction. This is realized by forming the active area AA to extend in the direction intersecting the gate electrode GC by the angle of (approximately 90−a tan($1/3$)).

Specifically, the active area AA is oblique to the row direction by an angle of approximately 71.565 degrees. Moreover, the active area AA is oblique to the column direction at an angle of approximately 18.453 degrees.

As described above, the via contact V0 can be arranged at substantially equivalent intervals in the column direction and the row direction by forming the ratio of the pitch of the active areas AA in the row direction to be $2/3$ times of the pitch of the gate electrodes GC, and causing the active area AA to be oblique by the angle of (approximately 90−a tan($1/3$)) from the row direction.

The memory cell MC of the variable resistance element RW according to the embodiment has an extremely small size, such as $6F^2$ ($3F \times 2F$). Here, "F" denotes the minimum processing size when a lithographic technology and an etching technology are used.

Writing and reading operations of data with respect to a selection memory cell MC is performed as follows. The word line WL connected to the gate electrode GC of the cell transistor CT included in the selection memory cell MC is referred to as the selection word line WL. Moreover, a pair of bit lines BL1 and BL2 connected to the selection memory cell MC is referred to as a pair of selection bit lines.

Firstly, a differential voltage is applied to the pair of the selection bit lines BL1 and BL2. Then, a voltage is applied to the selection word line WL. The cell transistor CT relevant to the selection memory cell MC is driven by applying a voltage to the selection word line WL. As the cell transistor CT is driven, a differential voltage between the pair of the selection bit lines BL1 and BL2 is applied to the variable resistance element RW relevant to the selection memory cell MC via the cell transistor CT. Accordingly, a current corresponding to the differential voltage flows in the variable resistance element RW, and thus, it is possible to perform writing and reading with respect to the variable resistance element RW.

Hereinafter, a manufacturing method of the first embodiment will be described with reference to FIGS. 5A and 5B to 21A and 21B.

In the below-described manufacturing method, when there is only one diagram for the reference drawing unless otherwise specified denotes, the one diagram corresponds to the cross-sectional view taken along line A-A in FIG. 3 (excluding FIGS. 15 to 18). In addition, when two diagrams having reference signs of A and B are present for the reference diagram, the two diagrams respectively correspond to the cross-sectional view taken along line A-A in FIG. 3 and the cross-sectional view taken along line B-B in FIG. 3 (excluding FIGS. 14A and 14B).

Figure 5A:
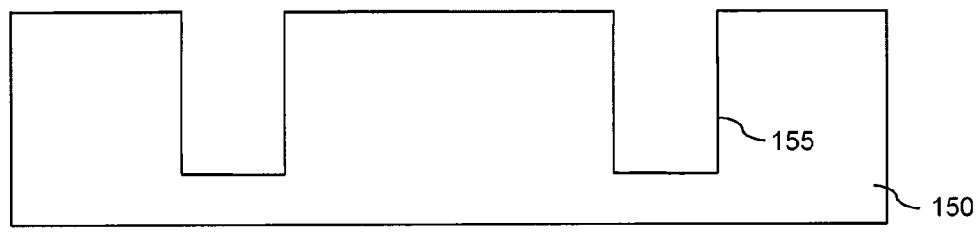
FIG. 5A is a cross-sectional view taken along line A-A in FIG. 3 to illustrate a manufacturing method for the memory device according to the first embodiment.
Figure 5B:
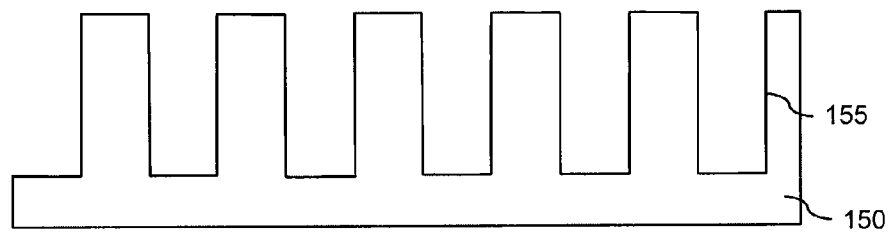
FIG. 5B is a cross-sectional view taken along line B-B in FIG. 3 to illustrate the manufacturing method for the memory device according to the first embodiment.

Firstly, as shown in FIGS. 5A and 5B, a trench 155 for forming the element isolation region STI is formed by performing etching on the semiconductor substrate 150.

Figure 6:
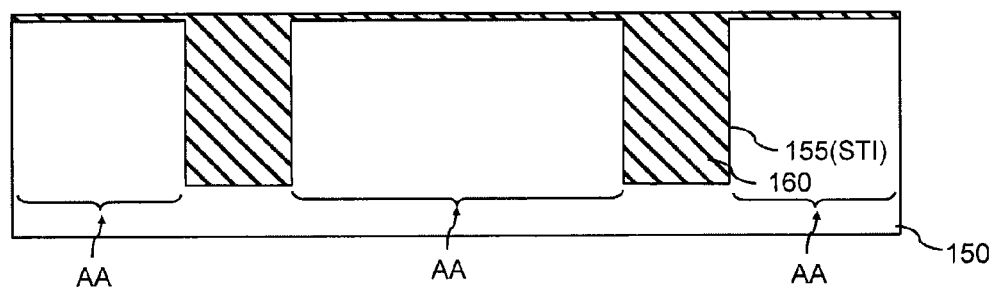
FIG. 6 is a cross-sectional view illustrating the manufacturing method for the memory device according to the first embodiment.

Next, as shown in FIG. 6, an element isolation insulation film 160 is filled so as to cause the trench 155 to be filled. The element isolation insulation film 160 is flattened by a reactive ion etching (RIE) method or a chemical mechanical polishing (CMP) method. The element isolation region STI is formed by performing flattening. The element isolation insulation film 160 is a silicon oxide film, for example. Regions other than the element isolation region STI is referred to as the active areas AA.

Figure 7:
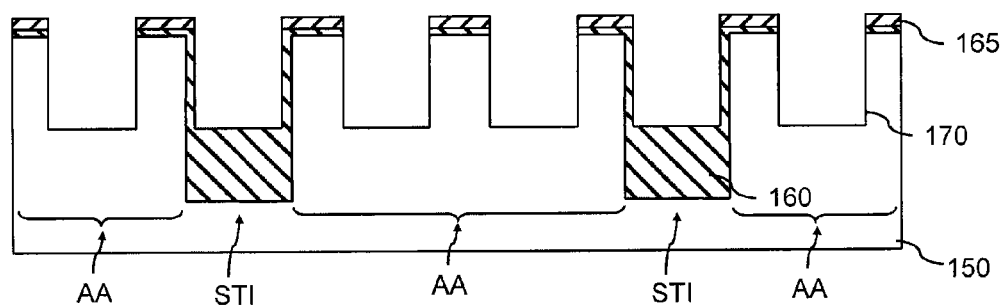
FIG. 7 is a cross-sectional view illustrating the manufacturing method for the memory device according to the first embodiment.

Next, as shown in FIG. 7, a first interlayer insulation film 165 is formed on the element isolation insulation film 160, and then, etching is performed to form a trench 170 for forming a gate electrode.

Figure 8A:
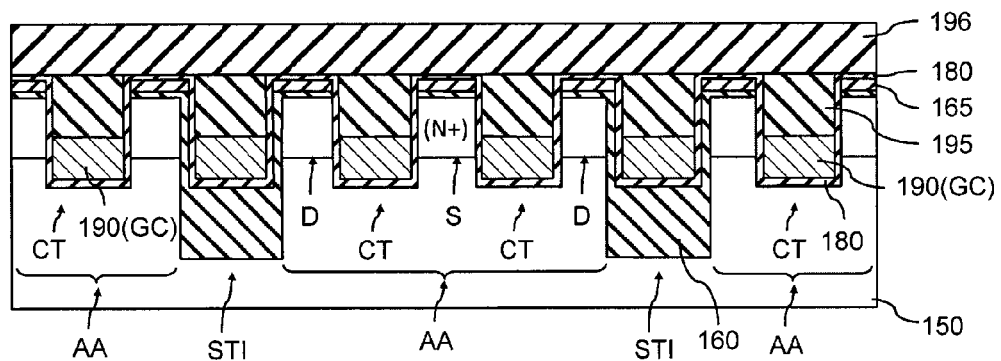
FIG. 8A is a cross-sectional view taken along line A-A in FIG. 3 to illustrate the manufacturing method for the memory device according to the first embodiment.
Figure 8B:
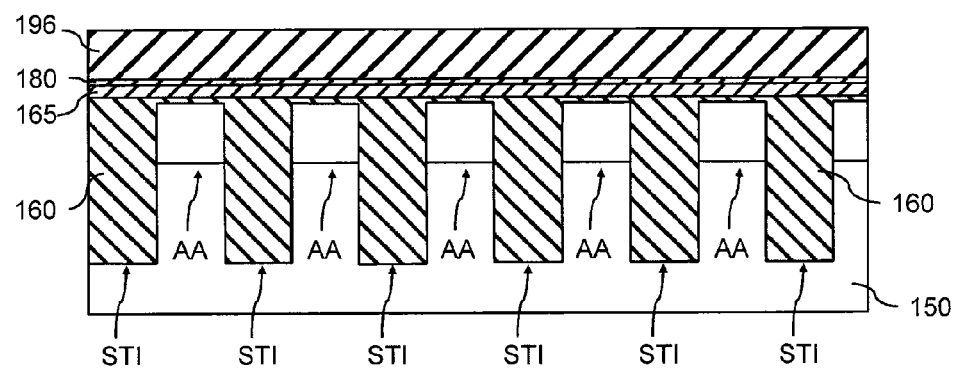
FIG. 8B is a cross-sectional view taken along line B-B in FIG. 3 to illustrate the manufacturing method for the memory device according to the first embodiment.

As shown in FIGS. 8A and 8B, the gate electrode GC and an embedded type cell transistor CT are formed. After forming the trench 170, the gate insulation film 180 and a gate electrode layer 190 are deposited. Thereafter, the gate insulation film 180 and the gate electrode layer 190 are removed to a predetermined height by performing etch-back. Subsequently, a CMP stopper film 195 is deposited, thereby performing flattening. Then, for example, phosphorus, arsenic, and the like are implanted so as to form the N-positive-type source region S and drain region D. Thereafter, a second interlayer insulation film 196 is deposited.

The gate insulation film 180 is deposited by a thermal oxidation method and the like using a silicon oxide film, a silicon nitride film, and a silicon oxy-nitride film, for example. The gate electrode layer 190 is formed using polycrystal silicon, tungsten, copper, and metal silicide, for example. The CMP stopper film 195 is formed using a silicon nitride film, for example. The second interlayer insulation film 196 is formed using a silicon oxide film, for example.

Figure 9A:
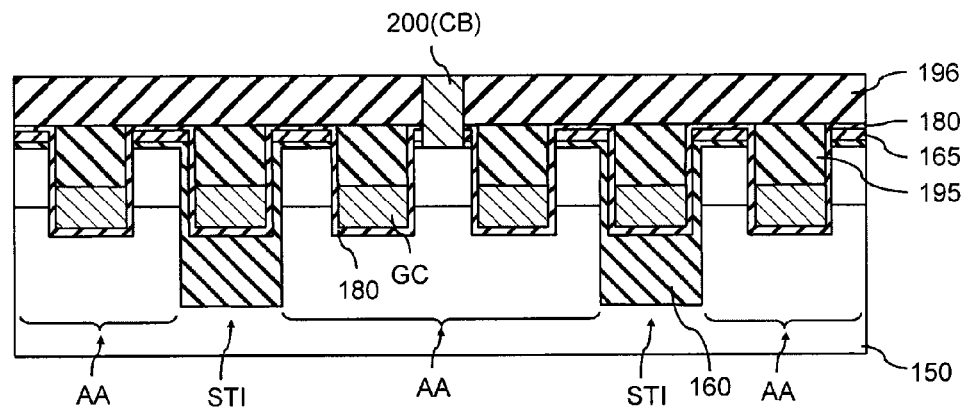
FIG. 9A is a cross-sectional view taken along line A-A in FIG. 3 to illustrate the manufacturing method for the memory device according to the first embodiment.
Figure 9B:
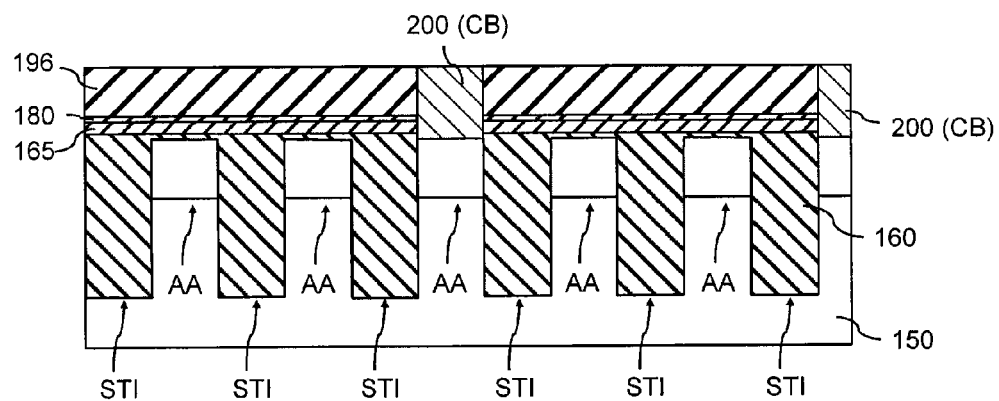
FIG. 9B is a cross-sectional view taken along line B-B in FIG. 3 to illustrate the manufacturing method for the memory device according to the first embodiment.

As shown in FIGS. 9A and 9B, the bit line contact CB is formed. A desired mask pattern is formed on the second interlayer insulation film 196 by a lithography method. Using the mask pattern as a mask, the second interlayer insulation film 196, the gate insulation film 180, the first interlayer insulation film 165, and the element isolation insulation film 160 are subjected to etching by the RIE method, thereby forming a bit line contact hole which reaches the source region S. After a bit line contact material 200 is deposited, materials in portions other than the bit line contact hole are removed by the CMP method. Accordingly, the bit line contacts CB are formed.

For example, the bit line contact material 200 includes a barrier metallic layer and a metallic layer. The barrier metallic layer is formed using conductive materials such as titanium, titanium nitride, and tungsten.

Figure 10A:
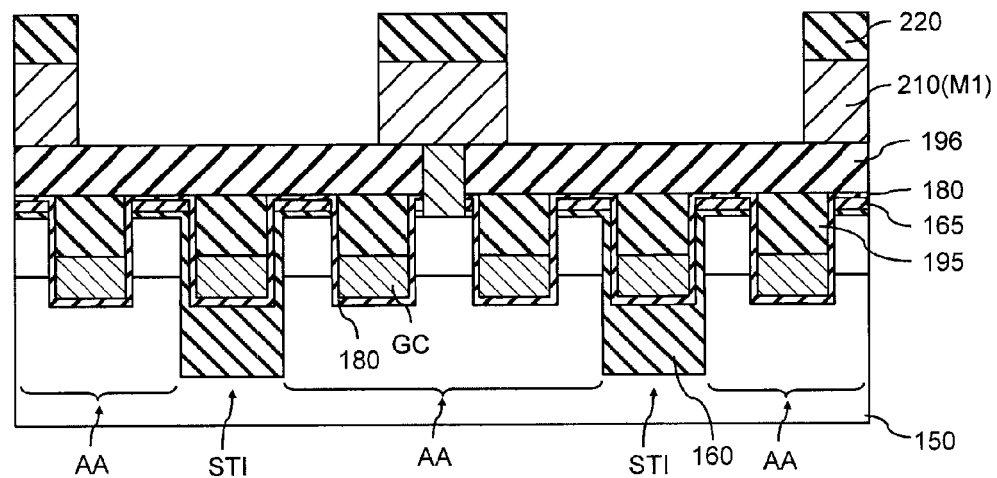
FIG. 10A is a cross-sectional view taken along line A-A in FIG. 3 to illustrate the manufacturing method for the memory device according to the first embodiment.
Figure 10B:
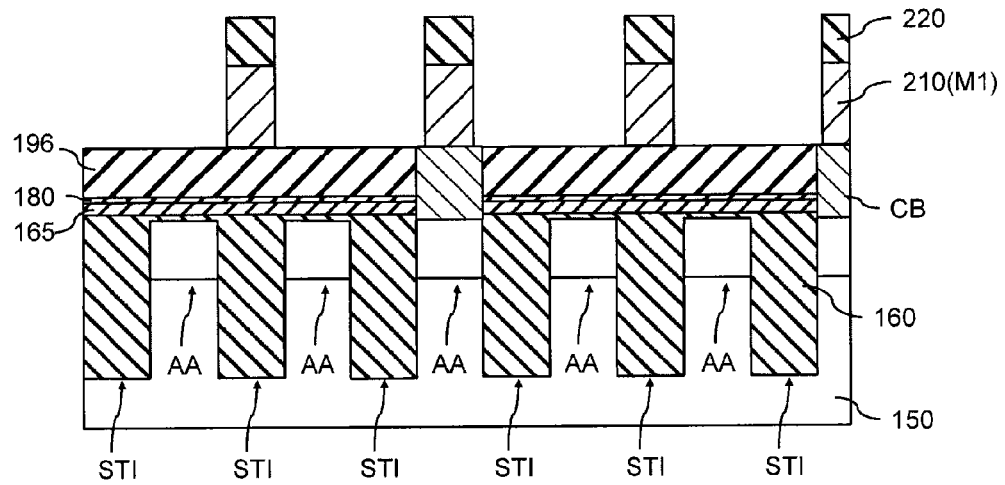
FIG. 10B is a cross-sectional view taken along line B-B in FIG. 3 to illustrate the manufacturing method for the memory device according to the first embodiment.

As shown in FIGS. 10A and 10B, the first interconnection layer M1 is formed. A first interconnection layer material 210 and a hard mask 220 are deposited. A desired mask pattern is formed on the hard mask 220 by the lithography method. Using the mask pattern as a mask, the hard mask 220 and the first interconnection layer material 210 are subjected to etching by the RIE method.

For example, first interconnection layer material 210 includes a barrier metallic layer and a metallic layer. The barrier metallic layer is formed using titanium, tantalum, niobium, titanium nitride, tantalum nitride, niobium nitride, or a stacked layer thereof, for example. The metallic layer is formed using tungsten, copper, aluminum, and the like. The hard mask 220 is formed using a silicon oxide film, a silicon nitride film, polycrystal silicon, carbon, or a stacked layer thereof, for example. The hard mask 220 is deposited by a plasma CVD method and the like.

Figure 11A:
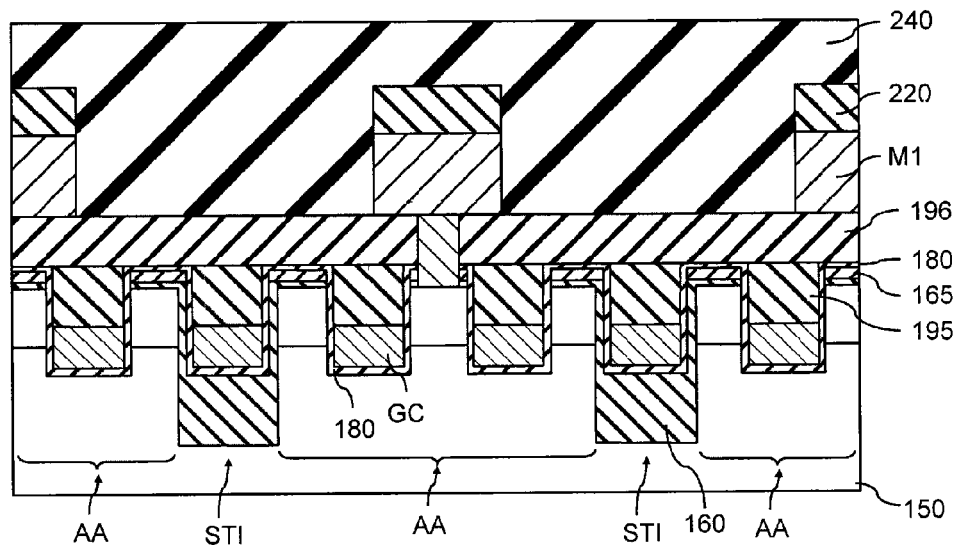
FIG. 11A is a cross-sectional view taken along line A-A in FIG. 3 to illustrate the manufacturing method for the memory device according to the first embodiment.
Figure 11B:
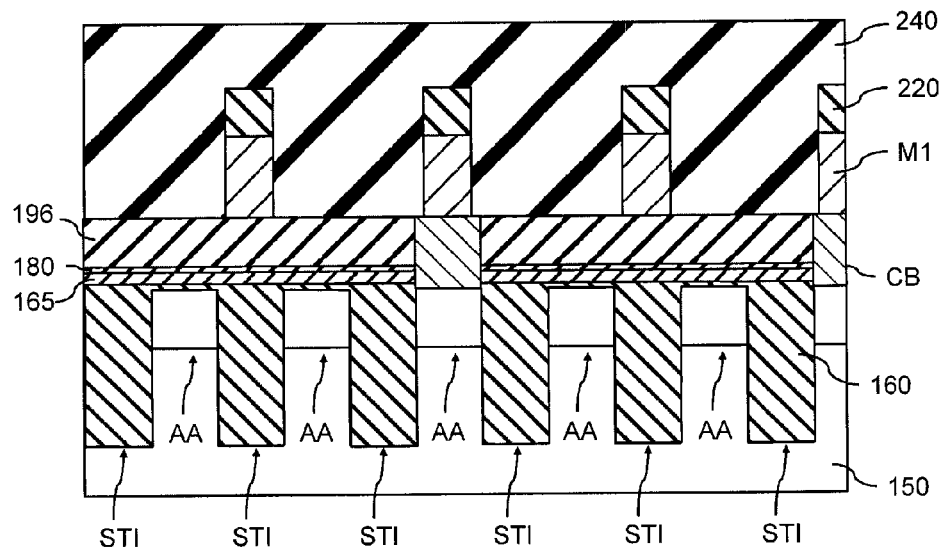
FIG. 11B is a cross-sectional view taken along line B-B in FIG. 3 to illustrate the manufacturing method for the memory device according to the first embodiment.

Next, as shown in FIGS. 11A and 11B, a third interlayer insulation film 240 is deposited so as to cover the first interconnection layer M1, the hard mask 220, and a base material. After deposition, flattening is performed by the CMP method as necessary. The third interlayer insulation film 240 is formed using a silicon oxide film, for example.

Figure 12A:
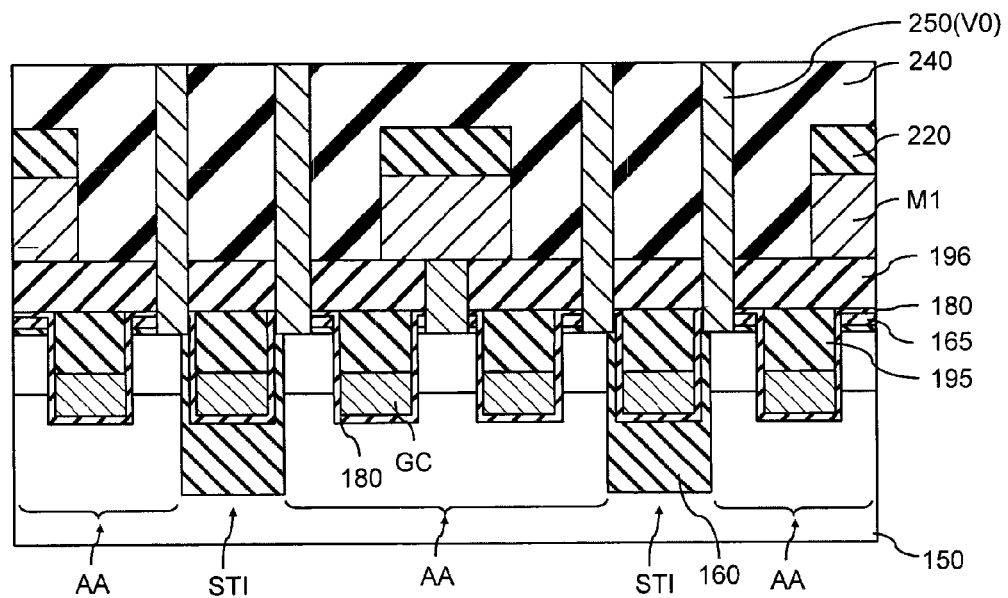
FIG. 12A is a cross-sectional view taken along line A-A in FIG. 3 to illustrate the manufacturing method for the memory device according to the first embodiment.
Figure 12B:
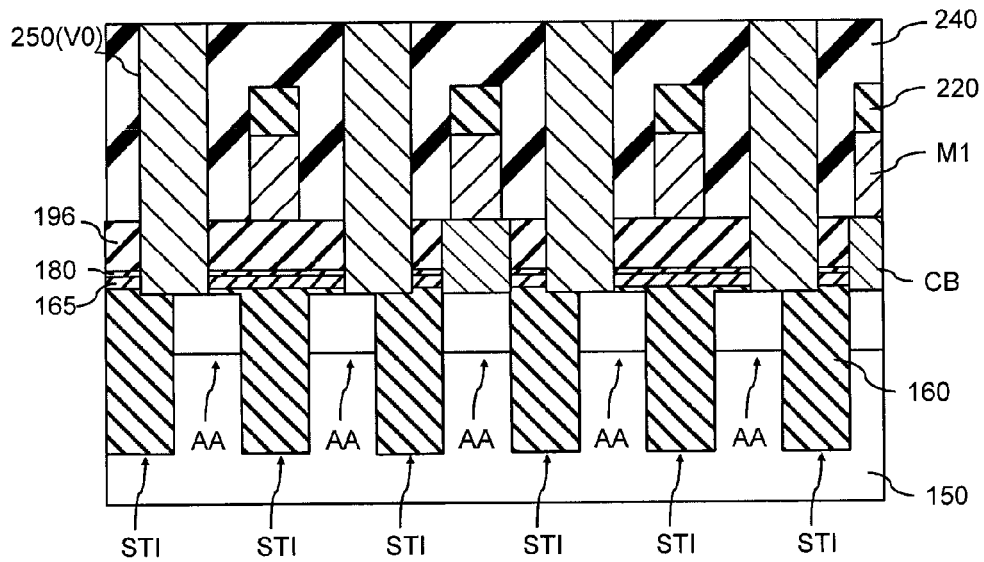
FIG. 12B is a cross-sectional view taken along line B-B in FIG. 3 to illustrate the manufacturing method for the memory device according to the first embodiment.

As shown in FIGS. 12A and 12B, the via contact V0 is formed. A desired pattern is formed on the third interlayer insulation film 240 by the lithography method. Using the pattern as a mask, via contact holes are processed by the RIE method so as to reach the drain regions D. After a via contact material 250 is deposited, the via contact materials 250 in portions other than the via contact holes are removed by the CMP method.

The via contact material 250 is formed using conductive materials such as titanium, titanium nitride, and tungsten.

Figure 13:
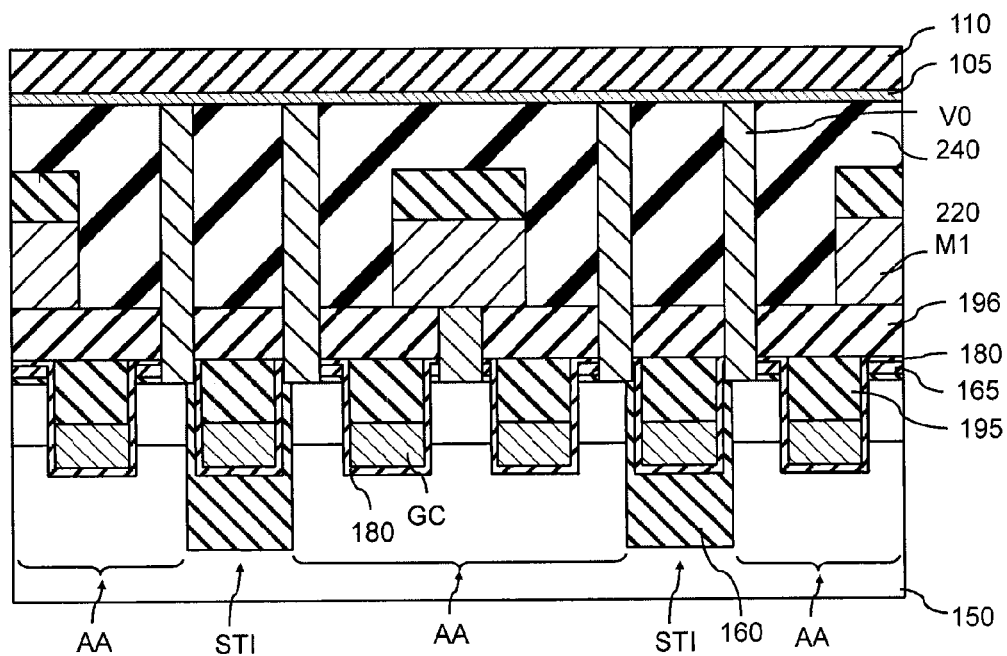
FIG. 13 is a cross-sectional view illustrating the manufacturing method for the memory device according to the first embodiment.

Subsequently, as shown in FIG. 13, the orientation layer 105 and the super-lattice layer 110 are formed. An electrode layer may be formed as necessary.

The orientation layer 105 is formed using the chalcogen compound having antimony and tellurium as the main components, or the chalcogen compound having bismuth and tellurium as the main components, for example.

In the super-lattice layer 110, the first crystal layer and the second crystal layer are alternately stacked. The first crystal layer is formed using the chalcogen compound having germanium and tellurium as the main components, for example. The second crystal layer is formed using the chalcogen compound having antimony as the main component, or the chalcogen compound having bismuth and tellurium as the main components, for example. An upper electrode layer is formed using a metallic layer of tungsten, for example.

With reference to FIGS. 14A and 14B to 18, processing of the orientation layer 105 and the super-lattice layer 110 will be described. The orientation layer 105 and the super-lattice layer 110 are processed being divided into two stages. In other words, as a first stage, a pattern of the active area AA is processed to be divided in line in a direction parallel to a major axis side of the active area AA. Thereafter, as a second stage, processing of dividing the pattern of the active area AA in line is performed.

Figure 14A:
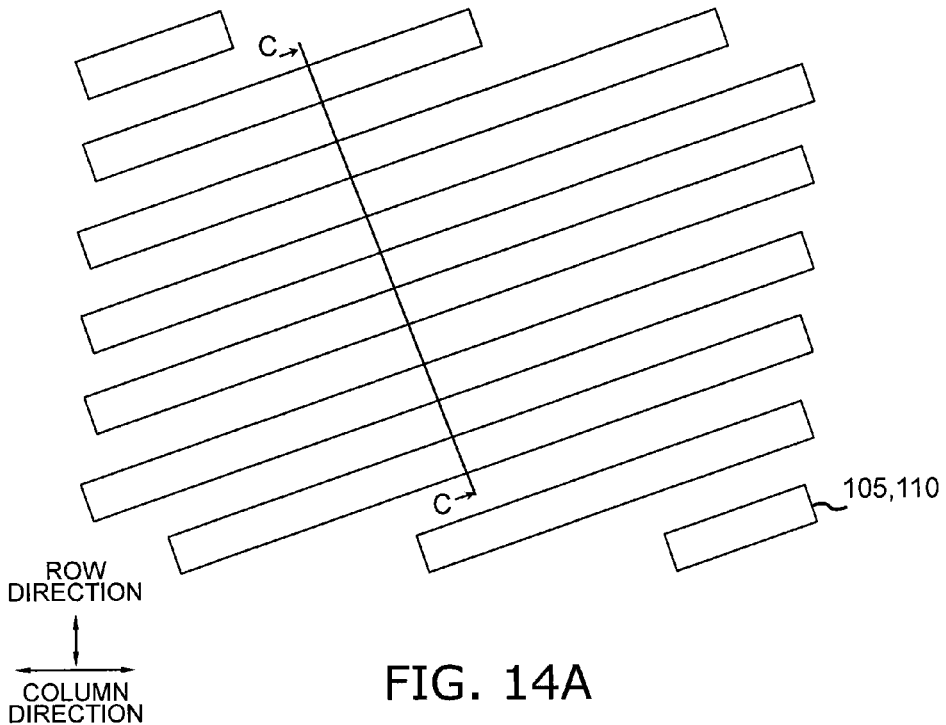
FIG. 14A is a layout of a variable resistance element illustrating the manufacturing method for the memory device according to the first embodiment.
Figure 14B:
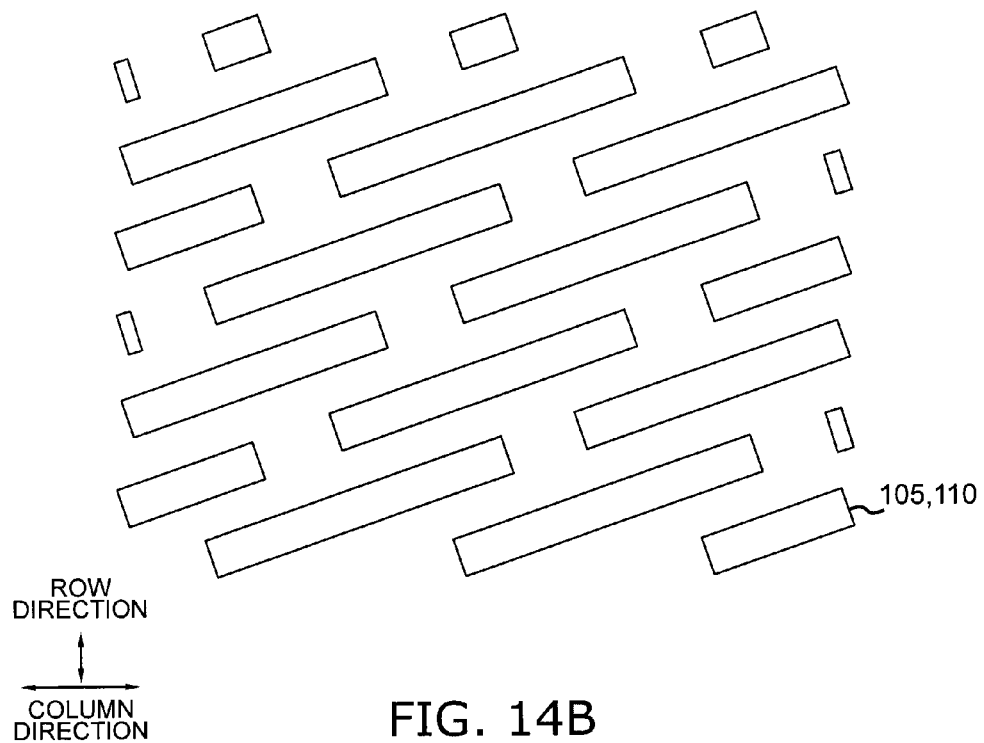
FIG. 14B is a layout of a variable resistance element illustrating the manufacturing method for the memory device according to the first embodiment.

FIG. 14A shows a layout of the orientation layers 105 and the super-lattice layers 110 after processing of the first stage. FIG. 14B shows a planar layout of the orientation layers 105 and the super-lattice layers 110 after processing of the second stage.

Hereinafter, transferring of a side wall in processing of the orientation layer 105 and the super-lattice layer 110 will be specifically described. FIGS. 15 to 18 are cross-sectional views taken along line C-C in FIG. 14A, schematically showing a portion upper than the top of the third interlayer insulation film 240. However, a structure inside the third interlayer insulation film 240 will not be illustrated.

Figure 15:
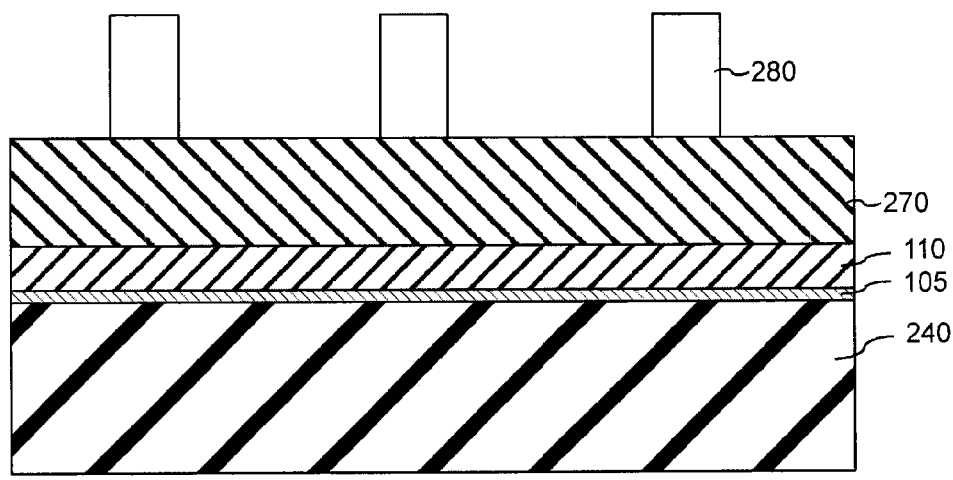
FIG. 15 is a cross-sectional view illustrating a method of processing the variable resistance element of the memory device according to the first embodiment.

As shown in FIG. 15, a sacrificial core material 270 is formed on the super-lattice layer 110. Moreover, a mask pattern 280 is formed on the sacrificial core material 270 by the lithography method and the like. The sacrificial core material 270 is formed using a silicon oxide film, a silicon nitride film, and a silicon film, for example.

Next, using the mask pattern 280 as a mask material, the sacrificial core material 270 is subjected to etching by the RIE method (not illustrated). Thereafter, the mask pattern 280 is removed by the Asher method and the like. After etching is performed, the sacrificial core material 270 may be subjected to etching by using a hydrofluoric acid aqueous solution or a mixed aqueous solution of ammonia and hydrofluoric acid, however the size of the sacrificial core material 270 may be allowed to be thinner.

Figure 16:
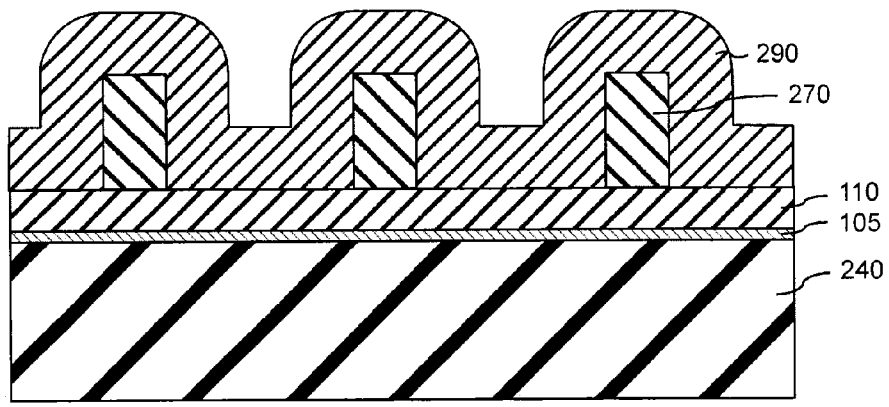
FIG. 16 is a cross-sectional view illustrating a method of processing the variable resistance element of the memory device according to the first embodiment.

As shown in FIG. 16, a hard mask material 290 is formed so as to cover the sacrificial core material 270. The hard mask material 290 is a material different from the sacrificial core material 270. The hard mask material 290 is formed using a silicon oxide film, a silicon nitride film, and a silicon film, for example. As the deposition method thereof, an atomic layer deposition (ALD) and a low-pressure CVD method are used, for example.

Figure 17:
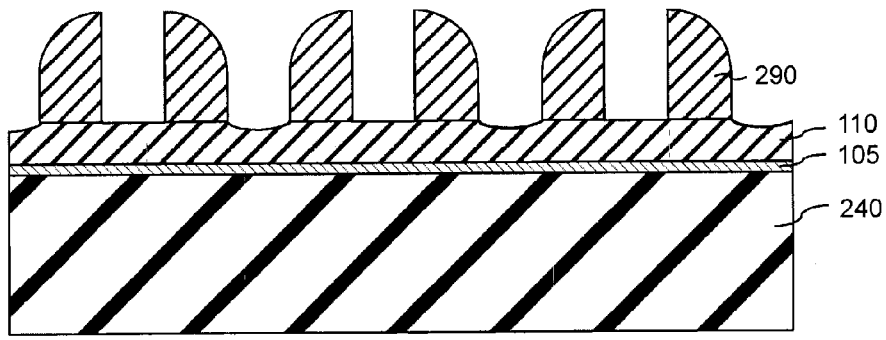
FIG. 17 is a cross-sectional view illustrating a method of processing the variable resistance element of the memory device according to the first embodiment.

As shown in FIG. 17, etching is performed with respect to the hard mask material 290 through etch-back by the RIE method until the sacrificial core material 270 is exposed. Thereafter, etching removal of the sacrificial core material 270 is performed by using chemicals including phosphoric acid, a choline aqueous solution (a trimethyl-2-hydroxyethyl ammonium hydroxide aqueous solution), hydrofluoric acid, and the like. As a result of etching removal, a side wall mask pattern having a desired space in width is formed by the hard mask material 290.

Figure 18:
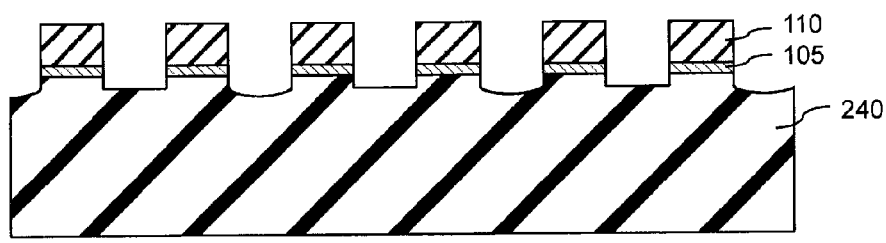
FIG. 18 is a cross-sectional view illustrating a method of processing the variable resistance element of the memory device according to the first embodiment.

Subsequently, as shown in FIG. 18, using the side wall mask pattern as a mask formed by the hard mask material 290, the orientation layer 105 and the super-lattice layer 110 are subjected to etching by the RIE method. When there is remaining hard mask materials 290 after etching is performed, chemicals such as phosphoric acid, a choline aqueous solution (trimethyl-2-hydroxyethyl ammonium hydroxide aqueous solution), and hydrofluoric acid are used to remove the hard mask material 290, for example. The layout of the orientation layer 105 and the super-lattice layer 110 is shown in FIG. 14A.

As shown in FIGS. 17 and 18, in a spatial portion of the orientation layer 105 and the super-lattice layer 110, there may be a case where depths of concavity of the third interlayer insulation film 240 are formed in an alternate cycle. This is because concavity of the super-lattice layer 110 obtained while processing the hard mask material 290 shown in FIG. 17 is transferred in its entirety, for example.

As a more specific example of the embodiment, the sacrificial core material 270 is formed using a silicon nitride film, and the hard mask material 290 is formed using a silicon film. The sacrificial core material 270 is removed by using phosphoric acid, and the hard mask material is removed by using a choline aqueous solution.

Subsequently, the following process is performed in order to form a pattern of FIG. 14B out of the line and space pattern of FIG. 14A.

Figure 19A:
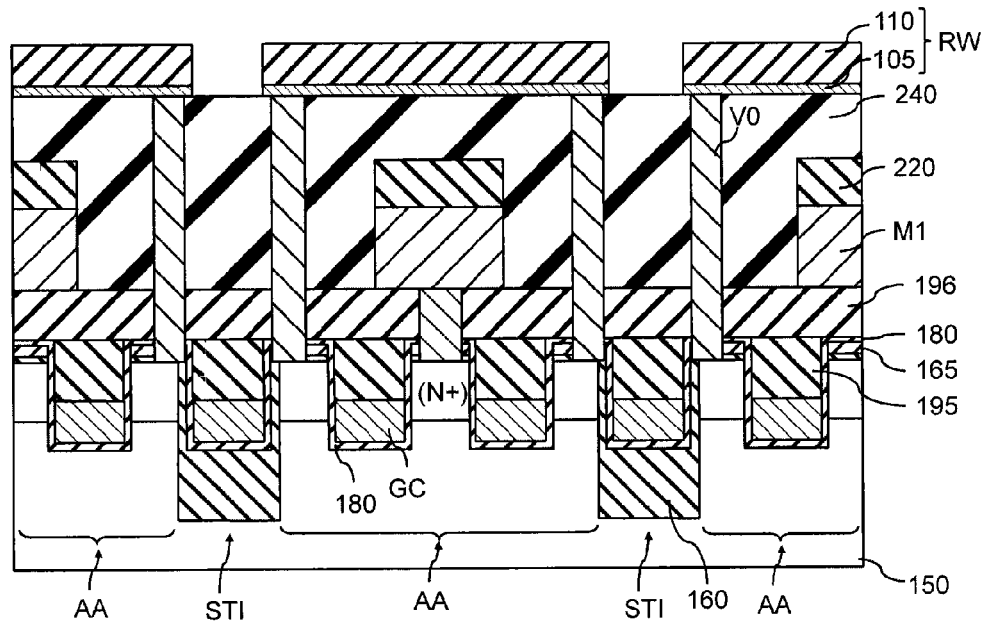
FIG. 19A is a cross-sectional view taken along line A-A in FIG. 3 to illustrate the manufacturing method for the memory device according to the first embodiment.
Figure 19B:
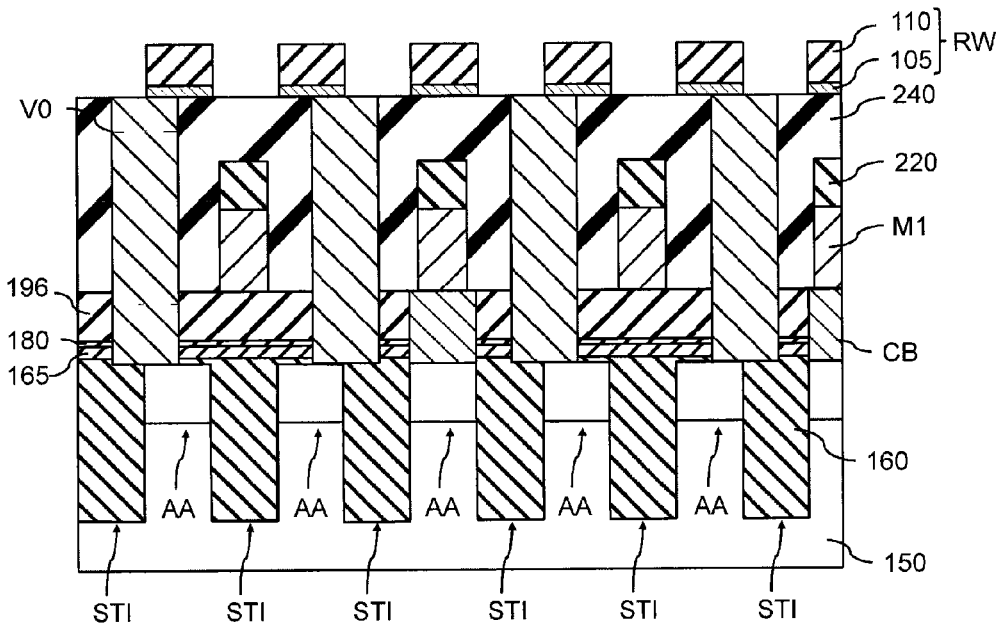
FIG. 19B is a cross-sectional view taken along line B-B in FIG. 3 to illustrate the manufacturing method for the memory device according to the first embodiment.

The mask pattern (not illustrated) is performed by the lithography method. Using the mask pattern as a mask, the orientation layer 105 and the super-lattice layer 110 are subjected to etching by the RIE method. A layout of the variable resistance layer shown in FIG. 14B is formed by performing etching. In this manner, the orientation layers 105 and the super-lattice layers 110 are mutually divided, thereby forming the variable resistance element RW. Diagrams of the aforementioned state respectively corresponding to a cross-sectional view taken along line A-A in FIG. 3 and a cross-sectional view taken along line B-B in FIG. 3 are shown in FIGS. 19A and 19B.

Figure 20:
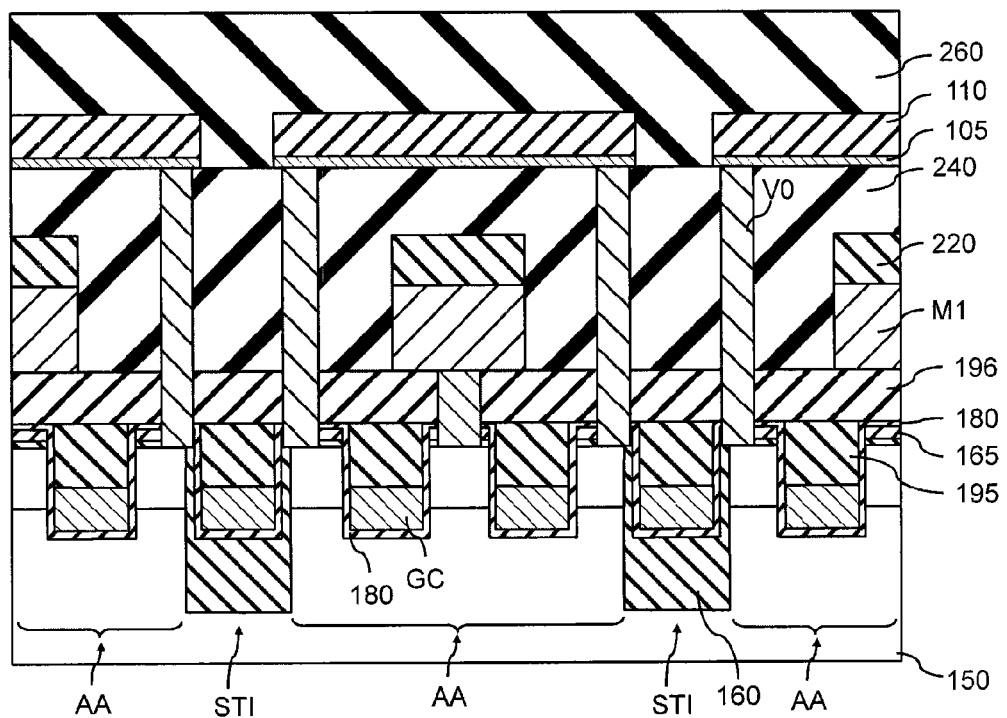
FIG. 20 is a cross-sectional view illustrating the manufacturing method for the memory device according to the first embodiment.

As shown in FIG. 20, a fourth interlayer insulation film 260 is deposited, and flattening is performed by the CMP method as necessary. The fourth interlayer insulation film 260 is formed using a silicon oxide film, for example.

Figure 21A:
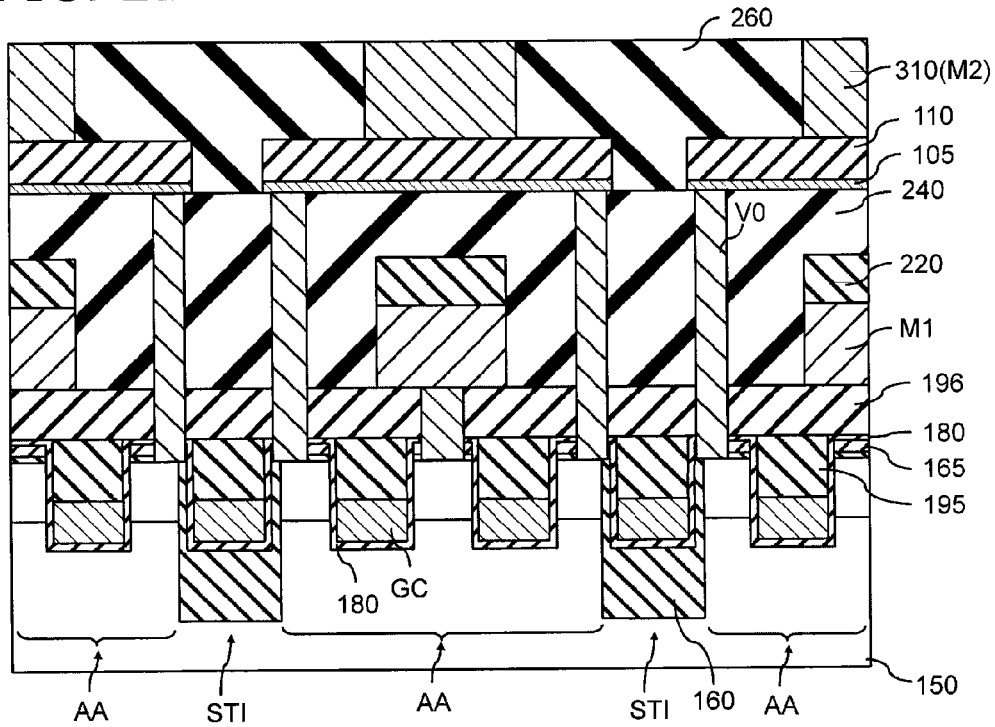
FIG. 21A is a cross-sectional view taken along line A-A in FIG. 3 to illustrate the manufacturing method for the memory device according to the first embodiment.
Figure 21B:
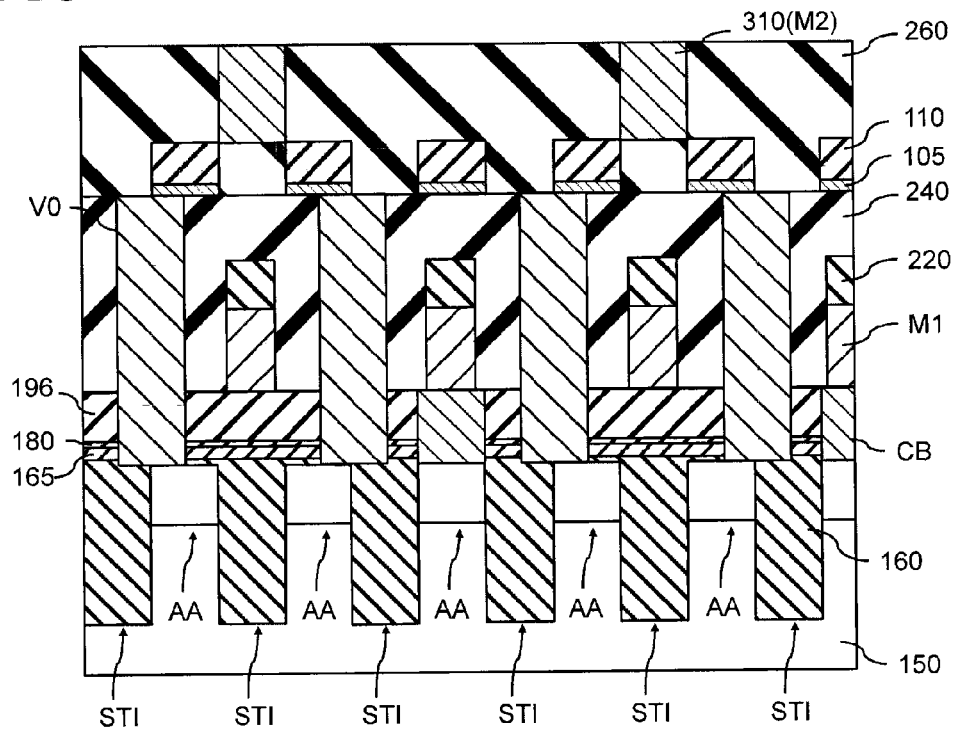
FIG. 21B is a cross-sectional view taken along line B-B in FIG. 3 to illustrate the manufacturing method for the memory device according to the first embodiment.

As shown in FIGS. 21A and 21B, the second interconnection layer M2 is formed. A desired mask pattern is formed on the fourth interlayer insulation film 260 by the lithography method. Using the mask pattern as a mask material, the fourth interlayer insulation film 260 is subjected to etching by the RIE method so as to reach the variable resistance element RW. A second interconnection trench is formed by performing etching. A second interconnection layer material 310 is deposited in the second interconnection trench, and the second interconnection layer material 310 in portions other than the second interconnection trench is removed by the CMP method. Accordingly, the second interconnection layer M2 is formed.

The second interconnection layer material 310 is formed using a barrier metallic layer and a metallic layer, for example. The barrier metallic layer is formed using titanium, tantalum, niobium, titanium nitride, tantalum nitride, niobium nitride, or a stacked layer thereof, for example. The metallic layer is formed using tungsten, copper, aluminum, and the like. As a specific aspect of the example, as stacked layer of titanium and titanium nitride is used for the barrier metal, and tungsten is used for the metallic layer.

Subsequently, various interconnection layers and circuit elements are formed by using a general manufacturing method. In this manner, the variable resistance memory of the embodiment is manufactured.

According to the example described above, in top of the variable resistance element RW and the second interconnection layer M2, the upper side of the variable resistance element RW and the second interconnection layer M2 can be electrically connected to each other without forming a new independent metallic layer which is different from the variable resistance element RW on the variable resistance element RW. Since the independent metallic layer can be omitted, a deposition process of the metallic layer, a lithography process, and an etching process can be minimized. The minimized process allows an improvement of yield and reduction of cost, and thus, it is possible to supply inexpensive memory devices.

It is advantageous to perform etching of the orientation layer 105 and the super-lattice layer 110 by dividing into two stages in the aspect of fine processing. In the first stage of forming the mask pattern by the lithography method, the pattern is formed in the same direction and the same cycle. In other words, it is easy to optimize exposure conditions performed by the lithography method. Therefore, it is possible to form finer mask patterns.

Moreover, since etching in the second stage is limited in an etching region, forming of the mask pattern by the lithography method and etching by the RIE method can be easily performed.

Since the via contacts V0 are arranged in the first direction and the second direction at equivalent intervals (equivalent pitches), forming of the mask pattern by the lithography method and etching by the RIE method can be easily performed.

In the above description, the cell transistor CT related to one active area AA has a common source region S and different drain regions D. However, the cell transistor CT may have a common drain region D and different source regions S.

The first interconnection layer M1 is set as the second bit line BL2, and the second interconnection layer M2 is set as the first bit line BL1. Conversely, the first interconnection layer M1 may be set as the first bit line BL1, and the second interconnection layer M2 may be set as the second bit line BL2.

When the sacrificial core material 270 is formed on the super-lattice layer 110, an insulating film such as a silicon oxide film may be deposited between the super-lattice layer 110 and the sacrificial core material 270. In this case, etching may be performed causing the insulating film to be integrally formed with the orientation layer 105 and the super-lattice layer 110 when performing etching of the orientation layer 105 and the super-lattice layer 110. In this case, the super-lattice layer 110 is not exposed to plasma while performing etching by the RIE method. Thus, reliability of the variable resistance element RW can be improved.

Second Embodiment

Figure 22:
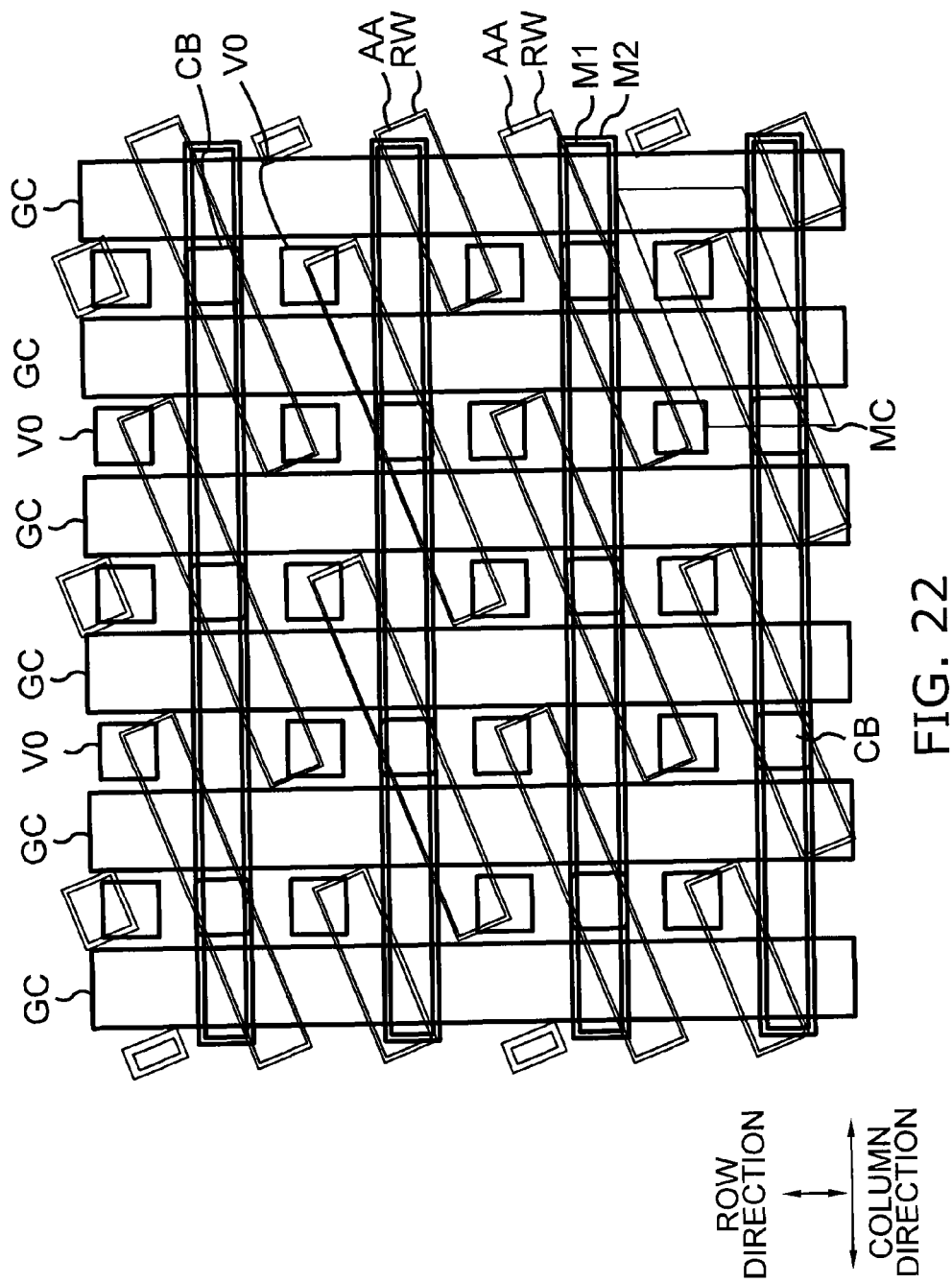
FIG. 22 is a layout of a variable resistance element illustrating a manufacturing method for the memory device according to the second embodiment.

FIG. 22 shows a planar layout of a second embodiment of the invention. The embodiment has a structure in which an interval between the via contacts V0 positioned next to each other is increased in the second direction by approximately 25% than that of the first embodiment.

In this manner, even though an interval between the adjacent via contacts V0 is increased, similar to the first embodiment, the upper portion of the variable resistance element RW can be connected to the second interconnection layer M2 without forming an independent metallic layer different from the variable resistance element RW thereon.

According to the embodiment, a width of the active area AA or an interval between the active areas AA adjacent to each other is increased by approximately 16% than that of the first embodiment. An increase of an interval between the active areas AA results in an increase of a channel width of the cell transistor CT which is formed on the active area AA. Then, a current flowing in the cell transistor CT is substantially proportional to the channel width. Therefore, when applying the same voltage as that of the first embodiment to the cell transistor CT, a current flowing in the cell transistor CT is increased by approximately 16%. In other words, more currents increased by approximately 16% can flow in the variable resistance element RW, and thus, reading and writing operations of the variable resistance element RW can increase in speed. As the operations of the variable resistance element RW increase in speed, it is possible to obtain memories capable of a high-speed operation.

Third Embodiment

Figure 23:
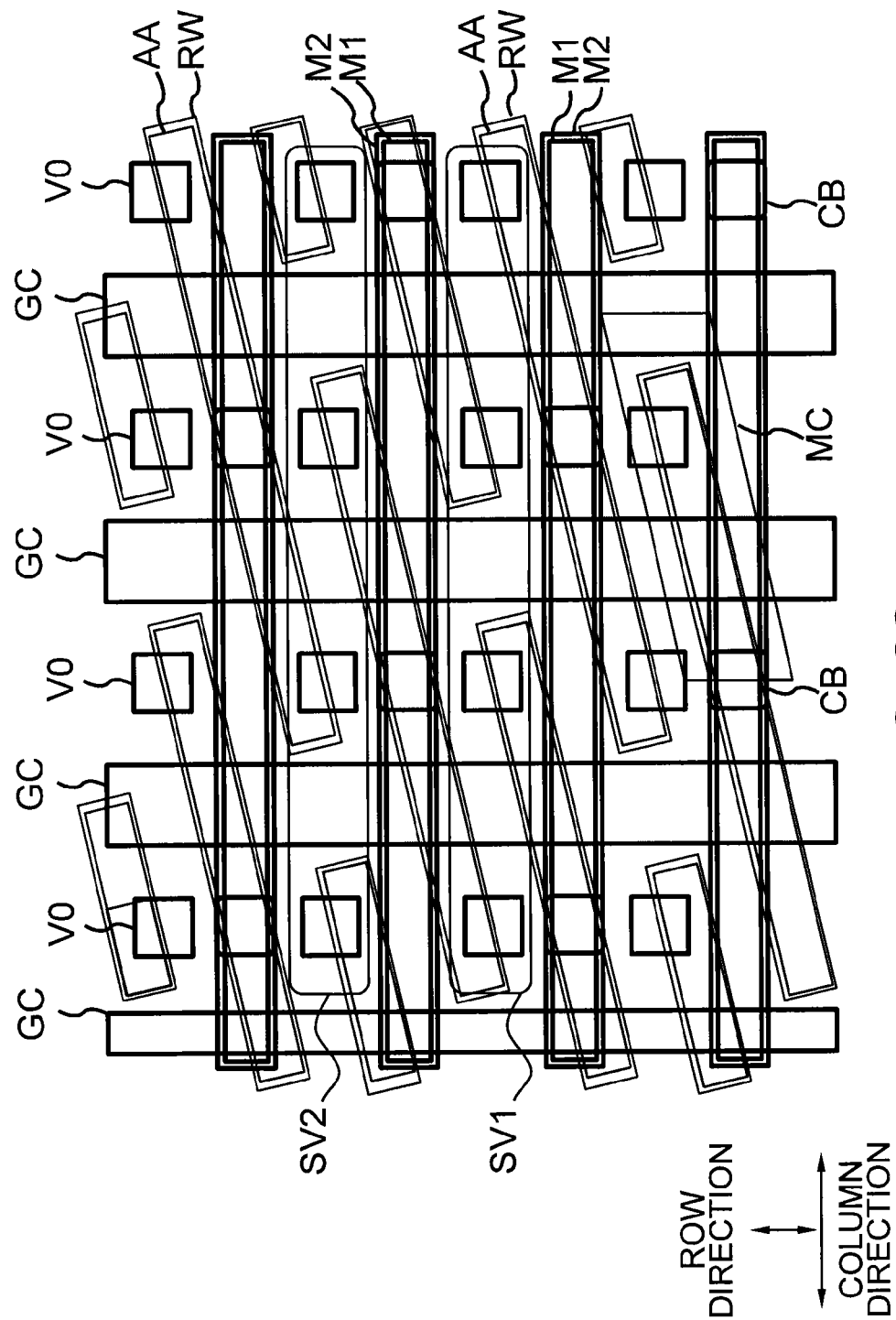
FIG. 23 is a layout of a variable resistance element illustrating a manufacturing method for the memory device according to the third embodiment.

FIG. 23 shows a planar layout of a third embodiment of the invention. The embodiment has a structure in which an interval between the via contacts V0 adjacent to each other is increased in the first direction by approximately 75% than that of the first embodiment. In the embodiment as well, the upper side of the variable resistance element RW can be connected to the second interconnection layer M2 without forming an independent metallic layer different from the variable resistance element RW thereon.

As shown in the first embodiment, the second embodiment, and the third embodiment, even though the pattern and the space in the first direction and the second direction are arbitrarily expanded or contracted, similarly to the first embodiment, the upper side of the variable resistance element RW can be connected to the second interconnection layer M2 without forming an independent metallic layer different from the variable resistance element RW thereon.

Fourth Embodiment

FIGS. 24 to 29 show a fourth embodiment of the invention.

In the embodiment, an etching method for the orientation layer 105 and the super-lattice layer 110 in FIGS. 15 to 18 of the first embodiment is performed in a manner of etching described below. Therefore, portions other than etching portion may be processed by the same method, thereby omitting descriptions thereof.

FIGS. 24 to 29 are cross-sectional views taken along line C-C in FIG. 14A in the embodiment and schematically shows a portion upper than the top of the third interlayer insulation film 240. However, a structure inside the third interlayer insulation film 240 will not be illustrated.

Figure 24:
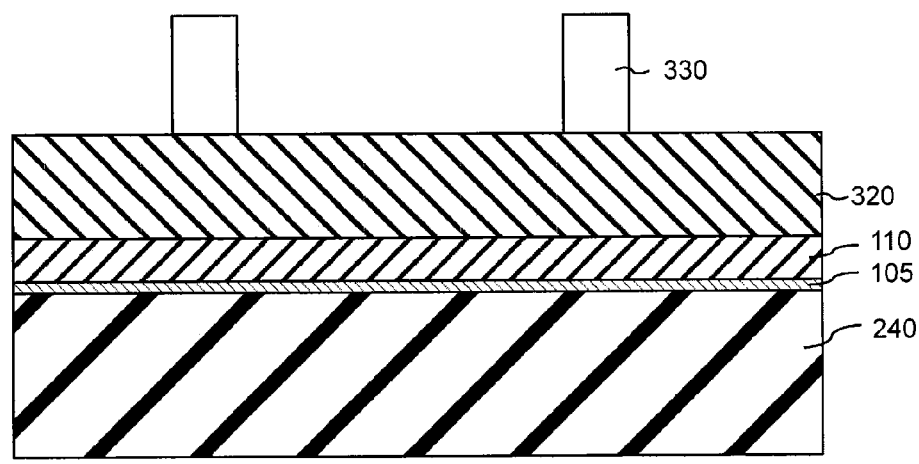
FIG. 24 is a cross-sectional view illustrating a method of processing the variable resistance element of the memory device according to the forth embodiment.

Firstly, as shown in FIG. 24, a first core material 320 is formed on the super-lattice layer 110. Then, a mask pattern 330 is formed on the first core material 320 by the lithography method. The first core material 320 is formed using a silicon oxide film, a silicon nitride film, and a silicon film, for example.

Next, using the mask pattern 330 as a mask material, the first core material 320 is subjected to etching by the RIE method (not illustrated). Thereafter, the mask pattern 330 is removed by the asher method and the like. Moreover, as necessary, the first core material 320 may be thinned by performing etching by using a hydrofluoric acid aqueous solution or a mixed aqueous solution of ammonia and hydrofluoric acid.

Figure 25:
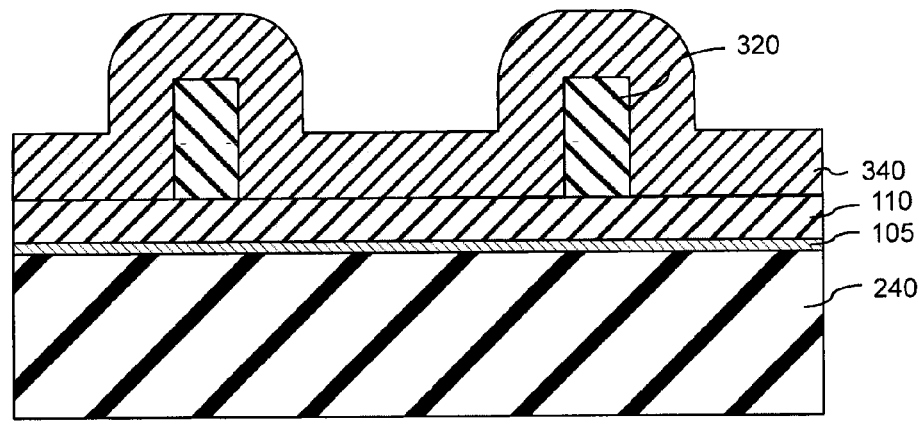
FIG. 25 is a cross-sectional view illustrating a method of processing the variable resistance element of the memory device according to the forth embodiment.

Subsequently, as shown in FIG. 25, a second core material 340 is formed so as to cover the first core material 320. Here, the second core material 340 is a material which is different from the first core material 320. For example, the second core material 340 is formed using a silicon oxide film, a silicon nitride film, and a silicon film, thereby being deposited by the low-pressure CVD method or the ALD method.

Thereafter, etch-back (not illustrated) is performed with respect to the second core material 340 by the RIE method until the first core material 320 is exposed.

Figure 26:
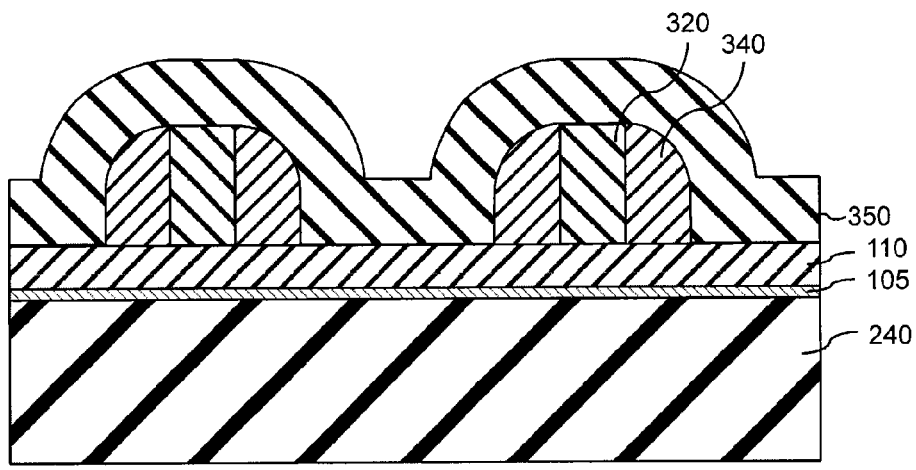
FIG. 26 is a cross-sectional view illustrating the method of processing the variable resistance element of the memory device according to the forth embodiment.

Subsequently, as shown in FIG. 26, a hard mask material 350 is deposited. The hard mask material 350 is a material which is different from the second core material 340. However, the hard mask material 350 is not necessarily different from the first core material. For example, the hard mask material 350 is formed using a silicon oxide film, a silicon nitride film, and a silicon film, thereby being deposited by the low-pressure CVD method or the ALD method.

Figure 27:
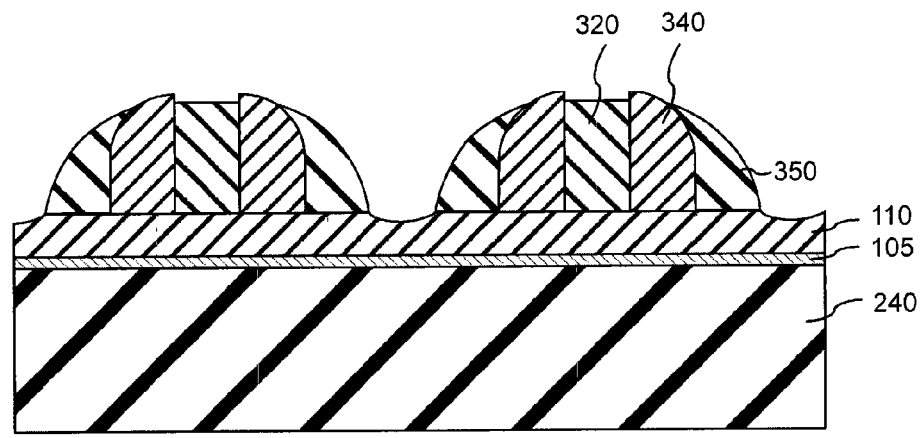
FIG. 27 is a cross-sectional view illustrating the method of processing the variable resistance element of the memory device according to the forth embodiment.

Subsequently, as shown in FIG. 27, etch-back is performed with respect to the hard mask material 350 until the second core material 340 is exposed.

Figure 28:
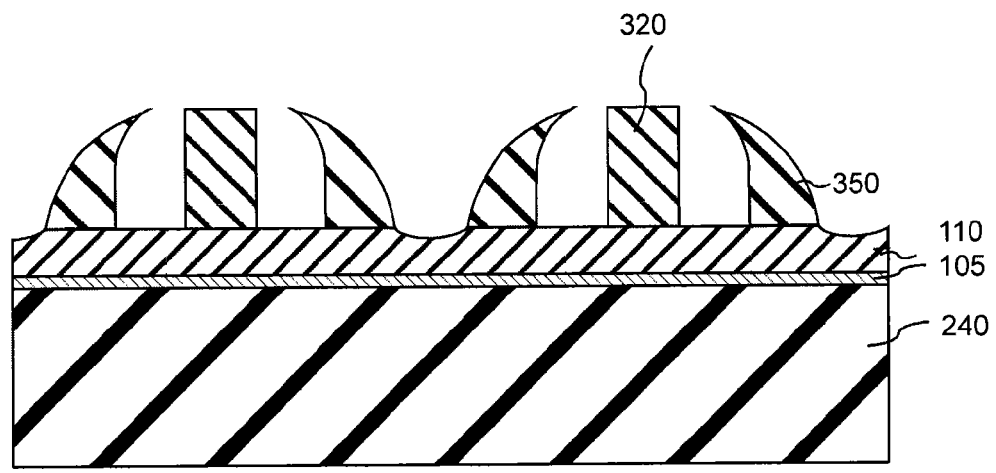
FIG. 28 is a cross-sectional view illustrating the method of processing the variable resistance element of the memory device according to the forth embodiment.

Subsequently, as shown in FIG. 28, etching removal of the second core material 340 is performed by using chemicals including phosphoric acid, a choline aqueous solution, and hydrofluoric acid. Accordingly, a core material mask and a side wall mask are formed using the first core material 320 and the hard mask material 350.

As a specific example, the first core material 320 is formed using a silicon nitride film, the second core material 340 is formed using a silicon film, and the hard mask material 350 is formed using a silicon nitride film. When removing the second core material, a choline aqueous solution is used, for example. As another example, the first core material 320 is formed using a silicon oxide film, the second core material 340 is formed using a silicon nitride film, and the hard mask material 350 is formed using a silicon oxide film. When removing the second core material, phosphoric acid is used, for example.

Figure 29:
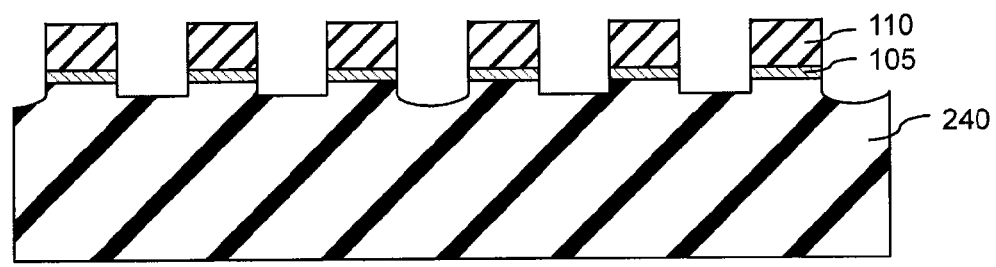
FIG. 29 is a cross-sectional view illustrating the method of processing the variable resistance element of the memory device according to the forth embodiment.

Subsequently, as shown in FIG. 29, using the first core material 320 and the hard mask material 350 as a mask material, the orientation layer 105 and the super-lattice layer 110 are subjected to etching by the RIE method. Moreover, as necessary, the first core material 320 and the hard mask material 350 are removed by using chemicals such as phosphoric acid, a choline aqueous solution, and hydrofluoric acid.

As shown in FIG. 29, in the spatial portions of the orientation layers 105 and the super-lattice layers 110, there may be a case where depths of concavity of the third interlayer insulation film 240 are formed in an every-second cycle. This is because concavity of the super-lattice layer 110 obtained while processing the hard mask material 350 shown in FIG. 27 is transferred in its entirety, for example.

The manufacturing method is similar to that in the first example, thereby omitting the descriptions thereof.

In the embodiment, an interval between the patterns at the time of forming the initial mask pattern 330 is greater than that in the first example, there is an advantage in that manufacturing can be performed more easily.

Fifth Embodiment

Figure 30:
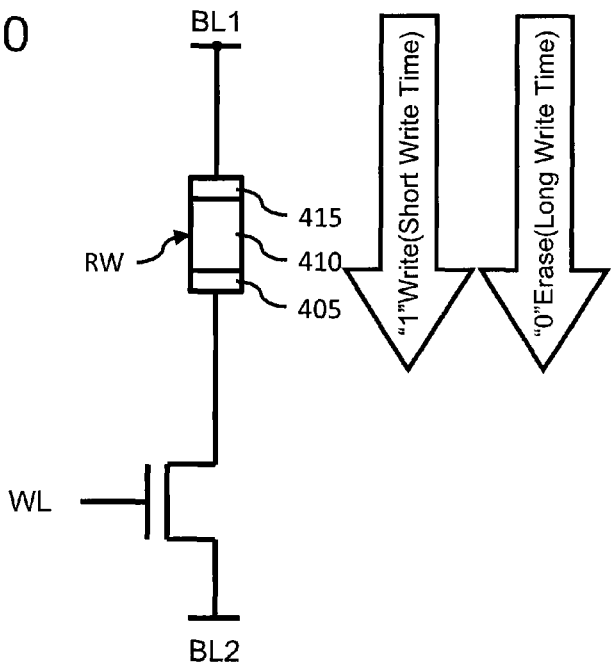
FIG. 30 is a diagram for describing an operation of the memory cell MC of the first embodiment.

FIG. 30 shows a configuration of the variable resistance element RW of a memory device in a fifth embodiment of the invention. Being different from the first embodiment, the memory device uses a phase change memory element as the variable resistance element RW.

The phase change memory element has a phase change layer 410 and a lower electrode layer 405. Otherwise, as shown in FIG. 30, the phase change memory element may have an upper electrode layer 415. The phase change layer 410 is formed using GST having germanium, antimony, and tellurium, for example. The structure of the GST can change between an amorphous state and a crystalline state by causing a current to flow and generating Joule heat. For example, the GST is high-resistance in the amorphous state and is low-resistance in the crystalline state.

Therefore, data can be stored similar to the above-described super-lattice phase change memory element by defining the low-resistance state as data "0" and defining the high-resistance state as data "1". Naturally, the low-resistance state may be defined as "1" and the high-resistance state may be defined as "0".

In order to make the phase change memory element transitional from the low-resistance state to the high-resistance state, a high voltage and a large current are caused to flow in the phase change layer 410 for a short period, and then, the current is suddenly decreased, for example. In other words, the GST configuring the phase change layer 410 is once fused by the large current. Thereafter, the GST can be in the amorphous state in response to rapid cooling caused by a sudden decrease of currents.

Meanwhile, in order to make the phase change memory element transitional from the high-resistance state to the low-resistance state, a high voltage and a large current are caused to flow in the phase change layer 410 for a short period, and then, the current is gradually decreased, for example. In other words, after the phase change layer 410 is fused by the large current, the GST can be in the crystalline state by maintaining a crystallization temperature.

The lower electrode layer 405 can be used for heating the phase change layer 410 as a Joule heat source. Titanium nitride can be exemplified as a specific material, and deposition is performed by a sputtering method or a CVD method. The upper electrode layer 415 is formed using tungsten, for example, and is deposited by the sputtering method or the CVD method.

As an example of the embodiment, in place of the orientation layer 105 and the super-lattice layer 110 in FIGS. 4A and 4B, the lower electrode layer 405, the phase change layer 410, and the upper electrode layer 415 are used as described above.

Accordingly, the phase change memory element can be used as the variable resistance element RW.

Figure 31:
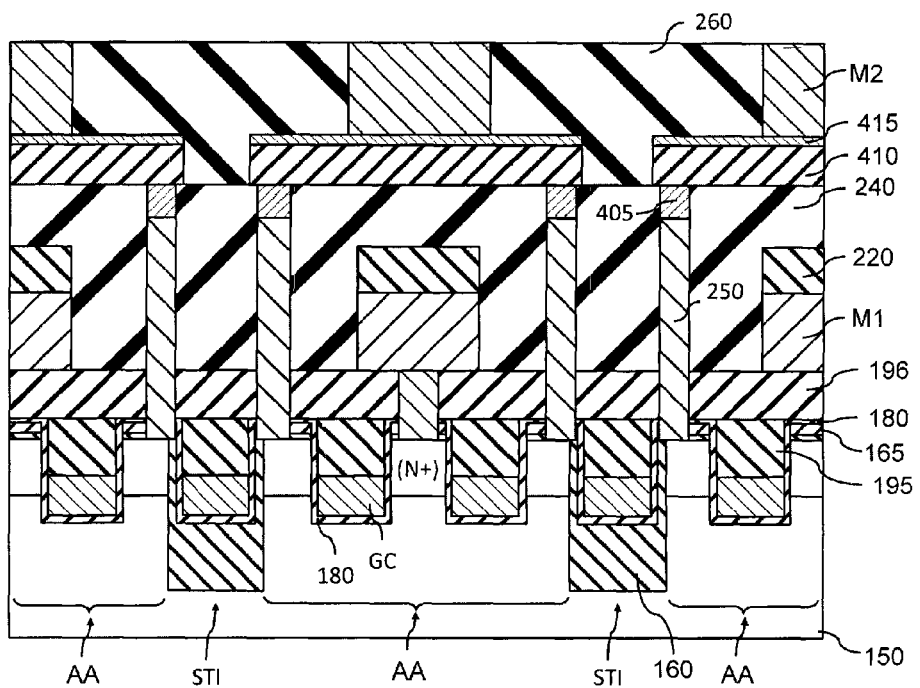
FIG. 31 is a cross-sectional view illustrating a manufacturing method for the memory device according to the fifth embodiment.

A variation will be described with reference to FIG. 31. FIG. 31 is a cross-sectional view taken along line A-A in FIG. 3. The variation has a difference in that the lower electrode layer 405 is formed on the via contact V0 inside the via contact hole.

The manufacturing method of the variation is as follows, for example. The via contacts V0 are formed as shown in FIGS. 12A and 12B by the method similar to that in the first embodiment. Thereafter, the via contact material 250 is subjected to etching to a predetermined height by the RIE method. Thereafter, the lower electrode layer 405 is deposited, and then, portions other than the via contact hole are removed by the CMP method.

Subsequently, the phase change layer 410 and the upper electrode layer 415 are deposited. Thereafter, the manufacturing method similar to that in the first embodiment may be adopted. When performing etching with respect to the via contact material 250 so as to remove the via contact material 250 to a predetermined height, etching may be performed only to the metallic layer portion which is a part of the via contact material, while leaving the barrier metallic layer behind.

In a case of the variation, a contact portion between the lower electrode layer 405 and the phase change layer 410 is small. Therefore, since a heating portion of the phase change layer 410 is small, a current or a voltage for writing and a current or a voltage for erasing can be decreased, and thus, it is possible to obtain a memory device driven by a low voltage constant current.

Figure 32:
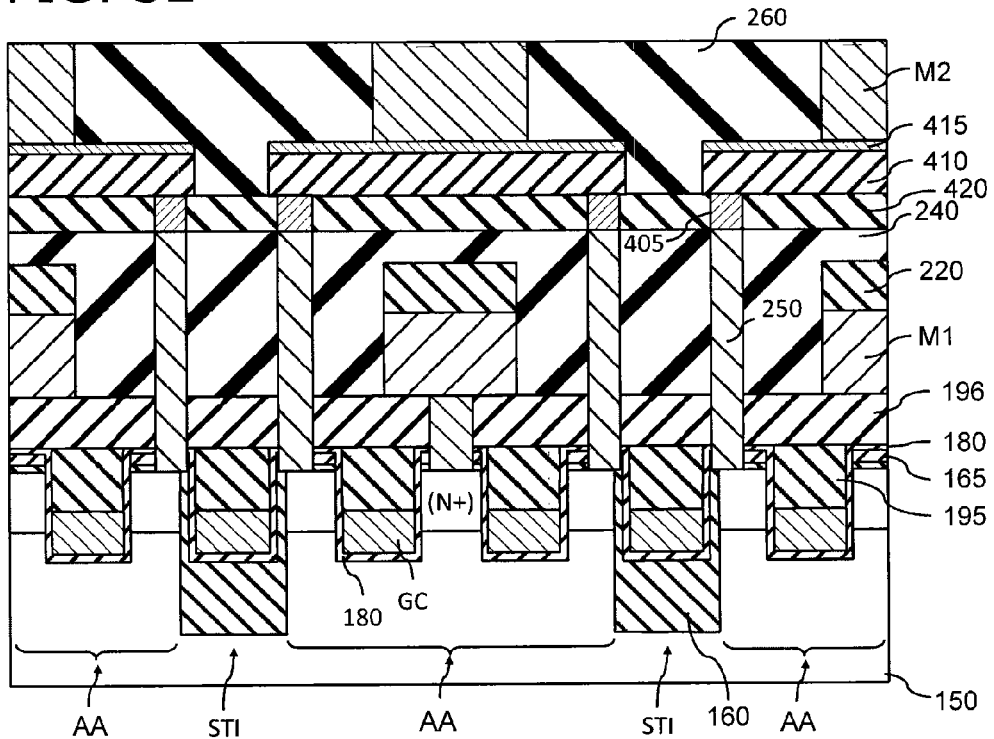
FIG. 32 is a cross-sectional view illustrating the manufacturing method for the memory device according to the fifth embodiment.

Another variation will be described with reference to FIG. 32. FIG. 32 is a cross-sectional view taken along line A-A in FIG. 3. In the variation, the forming method of the lower electrode layer 405 is different as described below.

Firstly, the via contact V0 is formed as shown in FIGS. 12A and 12B. Thereafter, a fifth interlayer insulation film 420 such as a silicon oxide film is deposited. A mask pattern having an opening above the via contact V0 is formed on the fifth interlayer insulation film 420 by the lithography method. Using the mask pattern as a mask, the fifth interlayer insulation film 420 is subjected to etching by the RIE method. The lower electrode layer 405 is deposited in the formed hole pattern, and the lower electrode layer 405 other than the hole patterns is removed by the CMP method. Thereafter, the phase change layer 410 and an upper electrode layer 415 are deposited, and then, the manufacturing method similar to that in the first embodiment may be adopted.

In the manufacturing method in FIG. 32, compared to the manufacturing method in FIG. 31, etching of the metallic layer inside the via contact V0 performed by the RIE method is not necessary. However, the number of processes is increased more than the manufacturing method in FIG. 31.

Figure 33:
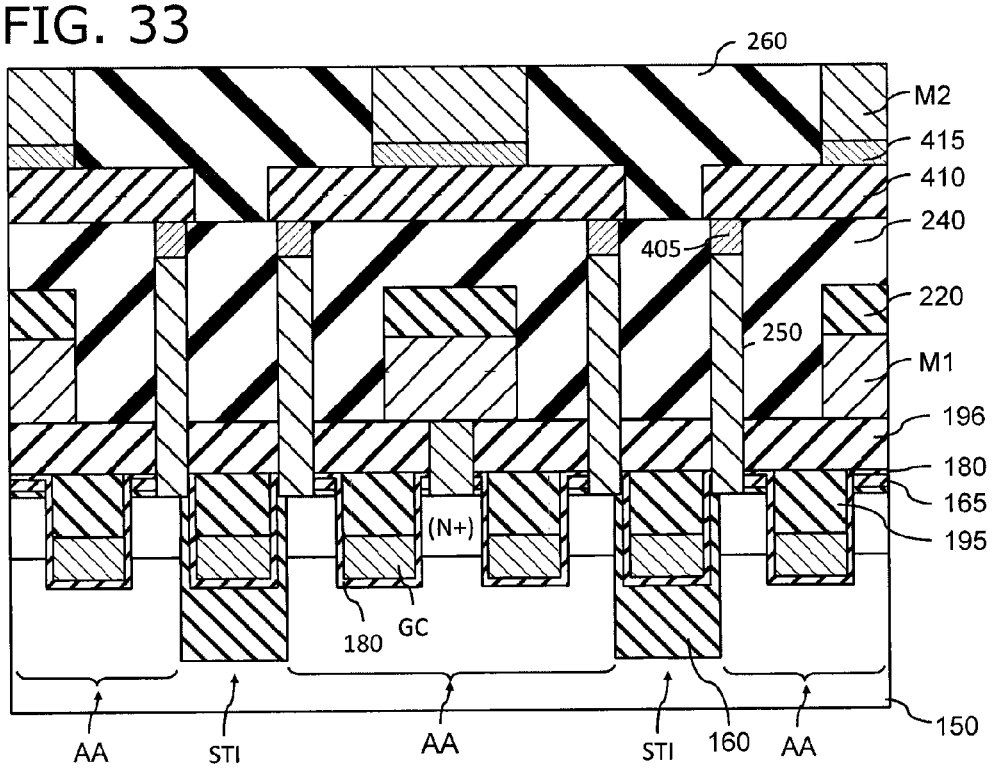
FIG. 33 is a cross-sectional view illustrating the manufacturing method for the memory device according to the fifth embodiment.

As further another variation, as a lower layer of the second interconnection layer M2 shown in FIG. 33, the upper electrode layer 415 of the phase change memory element may be formed.

Sixth Embodiment

Figure 34:
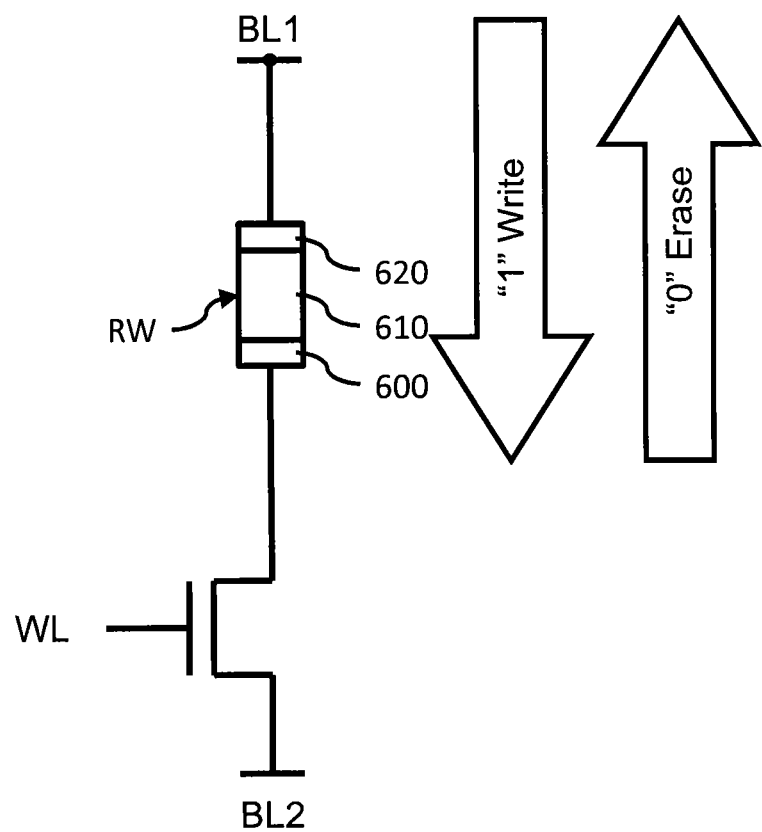
FIG. 34 is a diagram for describing an operation of the memory cell MC of the sixth embodiment.

FIG. 34 shows a configuration of the variable resistance element RW of the memory device in a sixth embodiment of the invention. Being different from the first embodiment, an ion memory element is used as the variable resistance element RW.

The ion memory element has an ion source electrode layer 600, an ion diffusion layer 610, and a counter electrode layer 620.

The counter electrode layer 620 is acceptable as long as a conductive material is used, for example, polycrystal silicon or a metallic material. When a metallic material is used, it is favorable to use a metallic element which is unlikely to be diffused in the ion diffusion layer 610.

As a typical example, when silicon is used in the ion diffusion layer 610, titanium nitride, molybdenum, or tantalum is used in the counter electrode layer 620, for example.

The ion diffusion layer 610 is acceptable as long as metal of a second electrode is diffusible. The ion diffusion layer 610 has highly electric-resistance. For example, The ion diffusion layer 610 includes silicon to which no n-type impurity or p-type impurity is intendedly added, silicon oxide, silicon nitride, and transitional metallic oxide are used.

It is favorable that the ion source electrode layer 600 is formed using a chemical element nonreactive to silicon. For example, it is preferable to use silver, copper, aluminum, cobalt, nickel, and titanium.

The ion memory element is transitional between the low-resistant state and the high-resistant state according to the following method.

When a voltage is applied to a portion between the ion source electrode layer 600 and the counter electrode layer 620 in a forward direction, metal atoms (metal ion) are conducted from the ion source electrode layer 600 to the ion diffusion layer 610. Accordingly, a filament is formed in the ion diffusion layer. The filament operates as a conductive path between the ion source electrode layer 600 and the counter electrode layer 620, and thus, the ion diffusion layer 610 is in the low-resistant state.

Meanwhile, when a relatively high voltage is applied to the portion between the ion source electrode layer 600 and the counter electrode layer 620 in a reverse direction, metal ions in the filament are subjected to ionic conduction conversely to an ion source electrode, thereby disconnecting the conductive path operated by the filament. Accordingly, the ion diffusion layer 610 is in the high-resistant state.

Therefore, data can be stored similar to the above-described super-lattice variation-type phase change memory element by defining the low-resistant state as data "0" and defining the high-resistant state as data "1". Naturally, the low-resistant state may be defined as "1" and the high-resistant state may be defined as "0".

As an example of the embodiment, in place of the orientation layer 105 and the super-lattice layer 110 in FIG. 4, the ion source electrode layer 600, the ion diffusion layer 610, and the counter electrode layer 620 are used as described above. In this case, any one between the ion source electrode layer 600 and the counter electrode layer 620 may be arranged on the top.

As the variation, the ion source electrode layer 600 or the counter electrode layer 620 may be formed on the via contact V0 in the via contact hole similarly to that in FIGS. 31 to 33, or may be formed as a lower layer of the second interconnection layer M2.

In the descriptions for several embodiments of the invention, the embodiments are proposed as examples and are not intended to limit the scope of the invention. The newly proposed embodiments can be executed in other various forms and can be subjected to various types of omission, replacement, and changes without departing from the spirit of the invention. The embodiments and the variations thereof are included within the scope and the spirit of the invention and are included within a scope which is equivalent to the invention disclosed in Claims.

What is claimed is:

1. A memory device comprising:
   a first diffusion layer region on a substrate;
   a second diffusion layer region on the substrate, the second diffusion layer region being provided apart from the first diffusion layer region;
   a third diffusion layer region on the substrate, the third diffusion layer region being provided apart from the second diffusion layer region, the second diffusion layer region being provided between the first diffusion layer region and the third diffusion layer region;
   a first gate electrode between the first diffusion layer region and the second diffusion layer region through a first insulating layer provided on the substrate;
   a second gate electrode between the second diffusion layer region and the third diffusion layer region through a second insulating layer provided on the substrate;
   a first via contact group including a plurality of first via contacts arranged along a first direction, the first direction being parallel to a surface of the substrate;
   a second via contact group including a plurality of second via contacts arrange along the first direction, the second via contact group being provided apart from the first via contact group in a second direction, the second direction being orthogonal in the first direction in the surface of the substrate; and
   a variable resistance element electrically connected to the first diffusion layer region and the second diffusion layer region,
   at least one of the plurality of first via contacts being electrically connected to the first diffusion layer region with one end,
   at least one of the plurality of second via contacts being electrically connected to the third diffusion layer region with one end,
   the at least one of the plurality of first via contacts and the at least one of the plurality of second via contacts being electrically connected to the variable resistance element with the other ends respectively,
   the variable resistance element being electrically a first interconnect layer.

2. The memory device according to claim 1, further comprising an active area provided on the substrate, the active area including the first diffusion layer region, the second diffusion layer region and the third diffusion layer region.

3. The memory device according to claim 1, further comprising a second interconnect layer electrically connected to the second diffusion layer region.

4. The memory device according to claim 1, wherein the variable resistance element is provided along a position that provides the first diffusion layer region, the second diffusion layer region and the third diffusion layer region.

5. The memory device according to claim 4, wherein
   the variable resistance element has a lower side and upper side,
   the lower side being electrically connected to the first via contact and the second via contact and
   the upper side being electrically connected to the first interconnect layer between the first via contact and the second via contact.

6. The memory device according to claim 1, wherein the variable resistance element includes a super-lattice layer having a layer that reversibly changes positions of atoms by supplying an electrical energy to the layer.

7. The memory device according to claim 6, wherein the variable resistance element includes an orientation layer that improves orientation of the super-lattice layer.

8. The memory device according to claim 1, the variable resistance element includes a phase change layer that changes a resistance value by changing a crystalline structure by Joule heat.

9. The memory device according to claim 6, wherein the variable resistance element includes at least one of Germanium, Antimony and Tellurium.

10. The memory device according to claim 6, wherein the variable resistance element includes an ion memory element that changes a resistance value with a direction of a voltage.

11. A memory device comprising:
   a substrate having a major surface parallel in a first direction and a second direction, the second direction crossing the first direction;
   a first word line on the substrate, the first word line extending in the second direction;
   a second word line provided on the substrate, the second word line extending in the second direction;
   a third word line provided on the substrate, the third word line extending in the second direction;
   a forth word line provided on the substrate, the forth word line extending in the second direction;
   a fifth word line provided on the substrate, the fifth word line extending in the second direction, the first word line, the second word line, the third word line, the forth word line and the fifth word line being provided apart from each other in order thereof;
   a first active area on the substrate, the first active area crossing at least the second word line and the third word line, the first active area extending in a third direction, the third direction parallel to the surface of the substrate crossing the first direction and the second direction;
   a second active area provided on the substrate, crossing at least the third word line and the forth word line, the second active area extending in the third direction;
   a first via contact electrically connected to the first active area between the first word line and the second word line with one end;
   a second via contact electrically connected to the first active area between the third word line and the forth word line with one end;
   a third via contact electrically connected to the second active area between the second word line and the third word line with one end;
   a forth via contact electrically connected to the second active area between the forth word line and the fifth word line with one end;
   a first variable resistance element electrically connected to the first via contact and the second via contact with other ends respectively;
   a second variable resistance element electrically connected to the third via contact and the forth via contact with other ends respectively;
   a first interconnect crossing above the first variable resistance element, the first interconnect extending in the first direction; and
   a second interconnect crossing the second variable resistance element above the second variable resistance element, the second interconnect being adjacent to the first interconnect, extending in the first direction.

12. The memory device according to claim 11 wherein the first interconnect layer is electrically connected to the first active area between the second word line and the third word line, and the second interconnect layer is electrically connected to the second active area between the third word line and the forth word line.

13. The memory device according to claim 11, further comprising:
   a third interconnect layer electrically connected to the first variable resistance element between the first via contact and the second via contact, the third interconnect layer being provided parallel to the first interconnect layer; and
   a forth interconnect layer electrically connected to the second variable resistance element between the third via contact and the forth via contact, the forth interconnect layer being provided parallel to the second interconnect layer.

14. The memory device according to claim 11, wherein
   the first word line and the second word line, the second word line and the third word line, the third word line and the forth word line, and the forth word line and the fifth word line are provided by a first pitch same as each other,
   a second pitch between the first via contact and the third via contact in the second direction is equal to $3/2$ times of a third pitch between the first active area and the second active area in the second direction, and
   a forth pitch between the first via contact and the third via contact in the first direction is equal to the first pitch.

15. The memory device according to claim 14, wherein a fifth pitch between the first interconnect layer and the second interconnect layer is equal to $3/2$ times of the third pitch.

16. The memory device according to claim 12, wherein the second interconnect layer is provided along a position that is half of the second pitch.

17. The memory device according to claim 11, wherein
   the first word line and the second word line, the second word line and the third word line, the third word line and the forth word line, and the forth word line and the fifth word line are provided by a first pitch same as each other, and
   a second pitch between the first via contact and the third via contact in the second direction is longer than $3/2$ times of a third pitch between the first active area and the second active area in the second direction.

18. The memory device according to claim 11, wherein
   the first word line and the second word line, the second word line and the third word line, the third word line and the forth word line, and the forth word line and the fifth word line are provided by a first pitch same as each other, and
   a second pitch between the first via contact and the third via contact in the second direction is shorter than $3/2$ times of a third pitch between the first active area and the second active area in the second direction.

19. A memory device comprising:
   a first active area;
   a second active area adjacent to the first active area; and
   an isolation area between the first active area and the second active area,
   the first active area including:
      a first diffusion layer region;
      a second diffusion layer region provided apart from the first diffusion layer region;
      a third diffusion layer region provided apart from the second diffusion layer region,
         the second diffusion layer region being provided between the first diffusion layer region and the third diffusion layer region;

a first gate electrode provided between the first diffusion layer region and the second diffusion layer region through a first insulating layer provided on the substrate;

a second gate region provided between the second diffusion layer region and the third diffusion layer region through a second insulating layer provided on the substrate;

a first interconnect layer electrically connected to the second diffusion layer;

a first via contact electrically connected to the first diffusion layer region with one end;

a second contact electrically connected to the third diffusion layer region with one end;

a variable resistance element electrically connected to the first diffusion layer region and the second diffusion layer region with other ends respectively; and a second interconnect layer electrically connected to the variable resistance element.

20. The memory device according to claim 19, wherein the isolation region includes a third gate electrode provided through a third insulating layer.

* * * * *